US009518450B2

(12) United States Patent
Servaes et al.

(10) Patent No.: US 9,518,450 B2
(45) Date of Patent: Dec. 13, 2016

(54) REAMER AND BIT INTERACTION MODEL SYSTEM AND METHOD

(71) Applicants: Luk Servaes, Lafayette, LA (US); John Ransford Hardin, Jr., Spring, TX (US); Stefano Mancini, Ravenna (IT); Eric Lauret, Tubize (BE); Shilin Chen, Montgomery, TX (US)

(72) Inventors: Luk Servaes, Lafayette, LA (US); John Ransford Hardin, Jr., Spring, TX (US); Stefano Mancini, Ravenna (IT); Eric Lauret, Tubize (BE); Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/603,986

(22) Filed: Jan. 23, 2015

(65) Prior Publication Data
US 2015/0198014 A1 Jul. 16, 2015

Related U.S. Application Data

(63) Continuation of application No. 12/984,473, filed on Jan. 4, 2011, now abandoned.

(30) Foreign Application Priority Data

Jan. 5, 2010 (WO) .................. PCT/IT2010/000002

(51) Int. Cl.
*G06G 7/48* (2006.01)
*E21B 41/00* (2006.01)
(Continued)

(52) U.S. Cl.
CPC .......... *E21B 41/0092* (2013.01); *E21B 10/00* (2013.01); *E21B 10/26* (2013.01); *G06F 17/10* (2013.01)

(58) Field of Classification Search
None
See application file for complete search history.

(56) References Cited

U.S. PATENT DOCUMENTS

| 5,415,030 A | * | 5/1995 | Jogi | ........................ E21B 12/02 175/39 |
| 5,704,436 A | | 1/1998 | Smith et al. | .................... 175/27 |

(Continued)

FOREIGN PATENT DOCUMENTS

| RU | SU 1231946 | 11/1995 | ............. E21B 44/00 |
| RU | 2174596 | 10/2001 | ............. E21B 44/00 |

OTHER PUBLICATIONS

Pessier et al. Quantifying Common Drilling Problems with Mechanical Specific Energy and a Bit-Specific Coefficient of Sliding Friction SPE 24584, SPE 1992.*

(Continued)

*Primary Examiner* — Saif Alhija
*Assistant Examiner* — Cuong Luu
(74) *Attorney, Agent, or Firm* — Baker Botts L.L.P.

(57) ABSTRACT

Teachings of the disclosure are directed to a reamer and/or bit interaction model system and method. The method may include receiving performance data regarding a cutting structure, and calculating a characteristic curve, using the performance data. The characteristic curve may be weight-based and/or torque-based. The method may also include storing the characteristic curve. In particular embodiments, the characteristic curve may include either weight on cutting structure or torque on the cutting structure, as a function of the rate of penetration.

18 Claims, 27 Drawing Sheets

(51) Int. Cl.
*E21B 10/00* (2006.01)
*E21B 10/26* (2006.01)
*G06F 17/10* (2006.01)

(56) References Cited

U.S. PATENT DOCUMENTS

| | | | | |
|---|---|---|---|---|
| 6,374,926 | B1* | 4/2002 | Goldman | E21B 12/02 175/39 |
| 6,785,641 | B1 | 8/2004 | Huang | 703/7 |
| 6,879,947 | B1* | 4/2005 | Glass | E21B 45/00 175/48 |
| 7,954,559 | B2 | 6/2011 | Paez | 175/57 |
| 8,082,134 | B2* | 12/2011 | Huang | E21B 10/00 703/10 |
| 8,274,399 | B2* | 9/2012 | Strachan | E21B 44/00 340/853.6 |
| 2005/0015229 | A1* | 1/2005 | Huang | E21B 10/00 703/10 |
| 2005/0038631 | A1 | 2/2005 | Steinke | 702/182 |
| 2005/0080595 | A1* | 4/2005 | Huang | E21B 44/00 702/183 |
| 2005/0096847 | A1* | 5/2005 | Huang | E21B 44/00 702/9 |
| 2005/0267719 | A1* | 12/2005 | Foucault | E21B 44/00 703/10 |
| 2005/0284661 | A1* | 12/2005 | Goldman | E21B 12/02 175/39 |
| 2006/0180356 | A1* | 8/2006 | Durairajan | E21B 10/42 175/431 |
| 2006/0195307 | A1* | 8/2006 | Huang | E21B 10/00 703/7 |
| 2007/0021857 | A1* | 1/2007 | Huang | E21B 10/00 700/117 |
| 2007/0029111 | A1* | 2/2007 | Chen | E21B 7/04 175/24 |
| 2007/0056772 | A1* | 3/2007 | Koederitz | E21B 44/02 175/53 |
| 2007/0093996 | A1* | 4/2007 | Cariveau | E21B 10/55 703/7 |
| 2007/0106487 | A1* | 5/2007 | Gavia | E21B 10/00 703/7 |
| 2008/0040084 | A1* | 2/2008 | Huang | E21B 10/00 703/7 |
| 2008/0125981 | A1* | 5/2008 | Steinke | E21B 10/00 702/34 |
| 2008/0255817 | A1* | 10/2008 | Pabon | E21B 44/00 703/10 |
| 2009/0055135 | A1* | 2/2009 | Tang | E21B 10/00 703/1 |
| 2009/0194332 | A1* | 8/2009 | Pastusek | E21B 21/08 175/40 |
| 2009/0250264 | A1* | 10/2009 | Dupriest | E21B 7/00 175/40 |
| 2010/0030527 | A1* | 2/2010 | Prasad | E21B 10/00 703/1 |
| 2010/0108380 | A1* | 5/2010 | Teodorescu | E21B 10/00 175/24 |
| 2010/0211362 | A1* | 8/2010 | Huang | E21B 44/00 703/1 |
| 2011/0035200 | A1* | 2/2011 | Huang | E21B 44/00 703/6 |
| 2011/0174541 | A1* | 7/2011 | Strachan | E21B 44/00 175/27 |
| 2013/0036077 | A1* | 2/2013 | Moran | E21B 7/00 706/21 |
| 2014/0039854 | A1* | 2/2014 | Huang | E21B 10/00 703/2 |
| 2014/0095134 | A1* | 4/2014 | Cariveau | E21B 10/00 703/7 |

OTHER PUBLICATIONS

Mexican Office Action issued in Appl. No. MX/a/2012/007827; 3 pages, Apr. 15, 2015.
Russian Office Action issued in Appl. No. RU2012133452; 11 pages with translation, Jan. 30, 2015.
Office Action, Mexican Application. No. MX/a/2012/007827; with machine translation; 6 pages, Oct. 19, 2015.
European Office Action, Application No. 10707678.8; 5 pages, Mar. 2, 2016.
Australian Office Action; Application No. 2010340695, 3 pages, Oct. 29, 2014.
International Preliminary Report on Patentability; PCT Appl. No. PCT/IT2010/000002, 10 pages, Jul. 10, 2012.
Okewunmi et al., "BHA Selection and Drilling Practices to Successfully Drill and Underream Difficult Deepwater GOM Salt Section, a Case History", AADE 2007.
Pessier et al., "Quantifying Common Drilling Problems with Mechanical Specific Energy and Bit-Specific Coefficient of Sliding Friction", SPE 24584, SPE 1992.
European Office Action; Application No. 10 707 678.8-1610; 5 pages, Feb. 18, 2014.
Russian Office Action with English Translation; Application No. 2012133452/03(053232); 15 pages, Oct. 1, 2013.
European Office Action; Application No. 10 707 678.8-1610; 5 pages, Jul. 5, 2013.
International Search Report and Written Opinion; PCT/IT2010/000002; 14 pages, Oct. 12, 2010.
T.M. Warrent; "Factors Affecting Torque for a Roller Cone Bit", Journal of Petroleum Technology, vol. 36, No. 10, pp. 1421-1508, Sep. 1984.
Teale, "The Concept of Specific Energy in Rock Drilling", International Journal rock Mechanics Mining Science, 1964.

* cited by examiner

| Reamers Selection | | | | | | | |
|---|---|---|---|---|---|---|---|
| Released Designs | | | | | | | |
| Selection with Filter | | | | | | | |
| Type: Any ▽  O.D.: Any ▽  Arm Count: Any ▽  Layout: Any ▽  Filter | | | | | | | |
| Body: Any ▽  Pilot D.: 8.5 ▽  Blade Count: Any ▽  Cutter Size: Any ▽  Reset | | | | | | | |
| Selection by ID | | | | | | | |
| Material Number [ ]   Project Name [ ]   Search | | | | | | | |

| | Material Num... | Project | Type | O.D. | Pilot D. | Param... |
|---|---|---|---|---|---|---|
| ☐ | 571670 | U00064830 | XR 800 | 9.5 | 8.5 | MODEL |
| ☐ | 572743 | U00065820 | XR 800 | 9 | 8.5 | MODEL |
| ☐ | 572744 | U00067520 | XR 800 | 9.25 | 8.5 | MODEL |
| ☐ | 572745 | U00071420 | XR 800 | 9.25 | 8.5 | MODEL |
| ☐ | 572746 | U00064920 | XR 800 | 9.875 | 8.5 | MODEL |
| ☐ | 572834 | U00067920 | XR 800 | 10.625 | 8.5 | MODEL |
| ☐ | 572835 | U00072730 | XR 800 | 11.25 | 8.5 | MODEL |
| ☑ | 572836 | U00066920 | XR 800 | 12.25 | 8.5 | MODEL |
| ☑ | 573895 | U00067420 | XR 800 | 10.25 | 8.5 | MODEL |
| ☐ | 573897 | U00065220 | XR 800 | 12.25 | 8.5 | MODEL |
| ☐ | 583659 | U00072970 | XR 800 | 12.25 | 8.5 | MODEL |

Reamers Count [ 2 ]

Reamer Selection

| Database | Material Number | Project | Type | O.D. | Pilot D. | Param... |
|---|---|---|---|---|---|---|
| RELEASED | 572836 | U00066920 | XR 800 | 12.25 | 8.5 | MODEL |
| RELEASED | 573895 | U00067420 | XR 800 | 10.25 | 8.5 | MODEL |

Clear Selection     Delete from Selection

| Configurations Selection | | | | | | | |
|---|---|---|---|---|---|---|---|
| File | | | | | | | |
| ID. | Bit | Description | DC Number | Reamer | Pilot D. | Description | Project |
| 1 | 377802 | 8.5 - FM3653 | dc3582_084 | N/A | N/A | N/A | N/A |
| 2 | 434921 | 8.5 - FMH3655Z | dc13154_084 | N/A | N/A | N/A | N/A |
| 3 | 476238 | 8.5 - FMH3653ZZ | dc15148_084... | N/A | N/A | N/A | N/A |
| 4 | N/A | N/A | N/A | 572836 | 8.5 | XR 800 12.25 - Cutter Type 4, Track... | U00066920 |
| 5 | N/A | N/A | N/A | 573895 | 8.5 | XR 800 10.25 - Cutter Type 4, Track... | U00067420 |
| 6 | 377802 | 8.5 - FM3653 | dc3582_084 | 572836 | 8.5 | XR 800 12.25 - Cutter Type 4, Track... | U00066920 |
| 7 | 377802 | 8.5 - FM3653 | dc3582_084 | 573895 | 8.5 | XR 800 10.25 - Cutter Type 4, Track... | U00067420 |
| 8 | 434921 | 8.5 - FMH3655Z | dc13154_084 | 572836 | 8.5 | XR 800 12.25 - Cutter Type 4, Track... | U00066920 |
| 9 | 434921 | 8.5 - FMH3655Z | dc13154_084 | 573895 | 8.5 | XR 800 10.25 - Cutter Type 4, Track... | U00067420 |
| 10 | 476238 | 8.5 - FMH3653ZZ | dc15148_084... | 572836 | 8.5 | XR 800 12.25 - Cutter Type 4, Track... | U00066920 |
| 11 | 476238 | 8.5 - FMH3653ZZ | dc15148_084... | 573895 | 8.5 | XR 800 10.25 - Cutter Type 4, Track... | U00067420 |

Clear Configurations Selection

*FIG. 16*

| Lithology | | | | | |
|---|---|---|---|---|---|
| File  Display Unit | | | | | |
| Id | Zone Name | Rock Strength | | Depth | Length |
| 1 | Formation 1 | 18,000.00 [psi] | | 0.00 [ft] | 1,000.00 [ft] | Delete Zone |
| | | | | | | Insert Zone |
| 2 | Formation 2 | 10,000.00 [psi] | | 1,000.00 [ft] | 200.00 [ft] | Delete Zone |
| | | | | | | Insert Zone |
| 3 | Formation 3 | 25,000.00 [psi] | | 1,200.00 [ft] | 200.00 [ft] | Delete Zone |
| | | | | | | Insert Zone |
| 4 | Formation 4 | 18,000.00 [psi] | | 1,400.00 [ft] | 500.00 [ft] | Delete Zone |
| | | | | | | Add Zone |
| Display Current | Set As Current | Clear Current | | | |

*FIG. 17*

$W_B[lb]$ = WEIGHT ON BIT (WOB)
$W_R[lb]$ = WEIGHT ON REAMER (WOR)
$W_{SC}[lb]$ = CALCULATED WEIGHT ON SYSTEM (WSYS CALCULATED)
$W_S[lb]$ = KNOWN WEIGHT ON SYSTEM (WSYS)
$T_B[ft\ lb]$ = TORQUE ON BIT (TOB)
$T_R[ft\ lb]$ = TORQUE ON REAMER (TOR)
$ea_B[in^2]$ = EFFECTIVE AREA OF BIT
$ea_R[in^2]$ = EFFECTIVE AREA OF REAMER
$er_B[in]$ = EFFECTIVE RADIUS OF BIT
$er_R[in]$ = EFFECTIVE RADIUS OF REAMER

REAMER AND BIT INTERACTION MODEL SYSTEM AND METHOD

CROSS REFERENCE TO RELATED APPLICATIONS

This application is a continuation application of U.S. patent application Ser. No. 12/984,473 filed Jan. 4, 2011, which claims the benefit under 35 U.S.C. §119 of International Patent Application No. PCT/IT2010/00002 filed Jan. 5, 2010, the contents of which are hereby incorporated in their entirety by reference.

TECHNICAL FIELD

The teachings of the present disclosure relate to the selection, analysis and evaluation of cutting structures and more particularly, to a reamer and bit interaction model system and method.

BACKGROUND

A drill bit at the end of a bottom hole assembly (BHA) is used to drill a hole through earth formations. The drill bit has a design with a cutting structure to accomplish this task. Models of the cutting structure can predict performance in terms of rate of penetration (ROP), force, torque, side force, vibration, walk tendencies, steerability etc. A drill bit may contain a secondary cutting structure that is intended to further enlarge the hole, such as a bi-center bit. For purposes of this disclosure, these secondary cutting structures may be considered to be part of the drill bit and not part of a reamer.

A reamer is utilized to enlarge a borehole through earth formations. The reamer has a design with a cutting structure to accomplish this task. Models of the cutting structure can predict performance in terms of rate of penetration (ROP), force, torque, side force, vibration, walk tendencies, steerability, etc.

A reamer may exist at the end of a BHA (without a drill bit) if the pilot hole formed by a drill bit already exists. Typically a reamer is utilized above a drill bit in the same BHA. Multiple reamers can also be deployed, each enlarging a different increment of hole size (with our without a drill bit). Multiple reamers of the same enlargement increment might also be used for redundancy in case of a failure of one cutting structure. Reaming can occur both in the downward and upward directions along the borehole.

A reamer may employ a fixed cutting structure, such as a single piece hole opener, or an expandable/retractable cutting structure for passing through restrictions in the wellbore completion, or to enlarge only specific sections of a borehole for specific purposes. Selective control of an expandable/retractable reamer could also be used to keep a reamer dormant as a backup in case of failure of a primary reamer cutting structure.

A simple way to characterize the performance of the drill bit and reamer cutting structures is needed. With a simple characterization, the performance of these cutting structures can be easily compared across a range of lithology and drilling parameters and evaluated against a set of constraints.

SUMMARY

The teachings of the present disclosure are directed to a reamer and/or bit interaction model system and method. In accordance with a particular embodiment, the method includes receiving performance data regarding a cutting structure, and calculating a characteristic curve, using the performance data. The characteristic curve may be weight-based and/or torque-based. The method further includes storing the characteristic curve.

In a particular embodiment of the present disclosure, the characteristic curve includes either (weight on cutting structure/rock strength) or (torque on the cutting structure/weight on the cutting structure), as a function of (rate of penetration/rotary speed).

In another embodiment of the present disclosure, the characteristic curve includes varying weight or torque on the cutting structure as a function of a rate of penetration of the cutting structure.

In accordance with yet another embodiment of the present disclosure, a method includes receiving first and second characteristic curves regarding first and second cutting structures, respectively. A system characteristic curve is calculated that combines the first characteristic curve and the second characteristic curve. The system characteristic curve may then be compared with other characteristic curves, and a bottom hole assembly may be selected, based upon the comparison.

In accordance with still another embodiment of the present disclosure a method includes receiving cutting structure selection criteria and displaying several cutting structures that meet some or all of the criteria to a user. The method may further include receiving a selection of cutting structures for comparison, from the user. In accordance with a particular embodiment of the present disclosure, the cutting structures of the selection may be compared using their respective characteristic curves. The results of the comparison may be displayed to the user.

Technical advantages of particular embodiments of the present disclosure include a reamer and bit interaction model system and method that allows for the collection of minimal data regarding a cutting structure(s), and the calculation, storage and/or display of a characteristic curve that reflects the anticipated performance of such cutting structure(s).

Another technical advantage of particular embodiments of the present disclosure includes a reamer and bit interaction model that enables quick selection of a particularly suitable drill bit, reamer, and/or combined reamer(s)/bit cutting structures using data from multiple source(s). In accordance with particular embodiments, the selection may meet a set of constraints across a spectrum of lithology and drilling parameters.

BRIEF DESCRIPTION OF THE DRAWINGS

For a more complete understanding of the present disclosure and its advantages, reference is now made to the following descriptions, taken in conjunction with the accompanying drawings, in which:

FIGS. 13-25 illustrate screen shots of a graphical user interface associated with a computer system that may be used to run software embodying instructions of the method of the present disclosure, in accordance with particular embodiments of the present disclosure;

FIG. 30 illustrates a computer system that may be used to implement aspects of the teachings of the present disclosure.

DETAILED DESCRIPTION

The teachings of the present disclosure provide a system and method that enables an efficient and rapid selection of a particularly suitable drill bit, reamer, and/or combined reamer(s)/bit cutting structures. The selection may be intended to meet a set of constraints and may address one or more of a spectrum of lithology and drilling parameters. Data from multiple source(s) may be used in the selection process. In accordance with a particular embodiment, systems or methods of the present disclosure may employ a software algorithm and/or a methodology that characterizes and analyzes drill bit and reamer cutting structure performance in a variety of ways.

Figure 1:
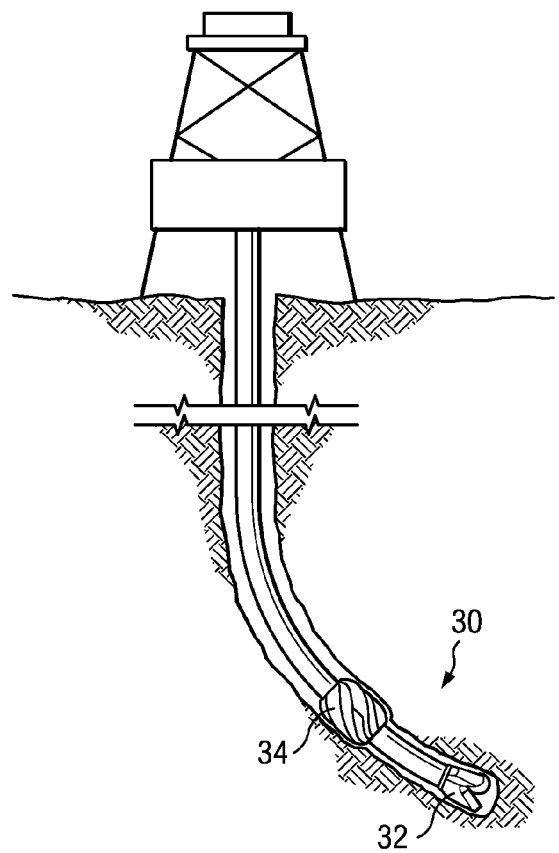
FIG. 1 illustrates reamer and bit cutting structures in an operating well, that may be selected in accordance with particular embodiments of the present disclosure.

FIG. 1 illustrates a bottom hole assembly 30 that includes multiple cutting structures including a cutting structure(s) associated with a drill bit 32 at the end of the bottom hole assembly BHA, and a cutting structure(s) associated with a reamer 34 located uphole from drill bit 30. Drill bit 32 at the end of the (BHA) is typically used to drill a hole through earth formations. Drill bit 32 has a particular design including a drill bit cutting structure(s) to accomplish this task. Models of the drill bit cutting structure may be used to predict performance in terms of rate of penetration (ROP), force, torque, side force, vibration, walk tendencies, steerability etc. In particular embodiments, drill bit 32 may contain one or more secondary cutting structures that are intended to further enlarge the hole, such as a bi-center bit. For purposes of this specification, these secondary cutting structures may be considered to be part of the drill bit and not part of a reamer.

Reamer 34 is typically utilized to enlarge a borehole through earth formations. Reamer 34 has a design with a reamer cutting structure(s) to accomplish this task. Models of the cutting structure can predict performance in terms of rate of penetration (ROP), force, torque, side force, vibration, walk tendencies, steerability, etc.

In alternative embodiments of the present disclosure, reamer 34 may be located at the end of a BHA (without a drill bit), for example, if the pilot hole formed by a drill bit already exists. A reamer can also be located higher up in a BHA without a drill bit if a pilot hole formed by a drill bit already exists. Typically, a reamer is utilized above a drill bit in the same BHA. Multiple reamers can also be deployed, each enlarging a different increment of hole size (with or without a drill bit). Multiple reamers of the same enlargement increment might also be used for redundancy in case of a failure of one cutting structure. Reaming can occur both in the downward and upward directions along the borehole.

A reamer may employ a fixed cutting structure, such as a single piece hole opener, or an expandable/retractable cutting structure for passing through restrictions in the wellbore completion, or to enlarge only specific sections of a borehole for specific purposes. Selective control of an expandable/retractable reamer may also be used to keep a reamer dormant as a backup in case of failure of a primary reamer cutting structure.

For the purposes of this specification, "cutting structure" refers to one or more structures on a BHA that accomplish a cutting or drilling operation. For example, a drill bit may include a single cutting structure, or multiple cutting structures. Similarly, a reamer will typically include only a single cutting structure, but a single reamer may also include multiple cutting structures.

The teachings of the present disclosure also provide a simplified system and method for characterizing the performance of the drill bit and/or reamer(s) cutting structures. With a simple characterization, the performance of these cutting structures can be easily compared with other cutting structures or combinations of cutting structures, across a range of lithology and drilling parameters, and evaluated against a set of constraints.

In accordance with the present disclosure, characteristic curves may be used to characterize the performance of a cutting structure or a system of cutting structures (e.g., drill bit 32 and/or reamer 34) in their relation to dominant environmental and operating factors such as: applied axial weight, torque, rock strength, rotation rate, and rate of penetration through rock. Once a characteristic curve is generated for a cutting structure, the details of cutter size, cutter position, cutter back rake angle, cutter side rake angle and other physical characteristics are not needed in order to predict its performance in any given lithology. For example, characteristic curves that are generated from actual, measured field performance data instead of models, do not require knowledge of such cutter details. The existence of characteristic curves allows individual cutting structures to be easily analyzed alone, or together in a system of cutting structures, to predict the performance of the system and/or select a particularly appropriate system for a given set of constraints.

Weight based and torque based simple characteristic curves of reamer and bit cutting structures are illustrated and described below.

For the purposes of this specification, the definition of the term "weight on bit" (WOB) includes the axial weight or force applied to a drill bit cutting structure, and the units may be given in pounds (lbs).

For the purposes of this specification, the definition of "weight on reamer" (WOR) includes the axial weight or force applied to a reamer cutting structure, and the units may be given in pounds (lbs).

For the purposes of this specification, the definition of "torque on bit" (TOB) includes the rotational torque generated at the drill bit cutting structure in response to the applied WOB, and the units may be given in foot pounds (ft lbs).

For the purposes of this specification, the definition of "torque on reamer" (TOR) includes the rotational torque generated at the reamer cutting structure in response applied WOR, and the units may be given in foot pounds (ft lbs).

For the purposes of this specification, the definition of "rock strength" (σ) includes the rock compressive strength and the units may be given in pounds per square inch (psi).

For the purposes of this specification, the definition of "rate of penetration" (ROP) includes the axial rate of penetration of a cutting structure through rock, and the units may be given in feet per hour (ft/hr).

For the purposes of this specification, the definition of "rotary speed" includes the rotation rate of a cutting structure, and the units may be given in revolutions per minute (RPM).

For the purposes of this specification, the definition of "weight on system" (WSYS) includes the axial weight or force applied to a BHA system of cutting structures, and the units may be given in pounds (lbs).

For the purposes of this specification, the definition of "torque on system" (TSYS) includes the resulting rotational torque generated from the BHA system of cutting structures in response to the applied WSYS, and the units may be given in foot pounds (ft lbs).

For the purposes of this specification, the definition of d is the depth of penetration per revolution of a cutting structure or system of cutting structures, and the units may be given in inches per revolution (in/rev) of the cutting structure or system of cutting structures.

Units used can differ from above. However, to the extent that calculations and/or comparisons are to be made, or graphs and/or data are to be combined (as described below), units should be used consistently.

In accordance with a particular embodiment of the present disclosure, the following methodology may be employed, and/or industry standards and literature accessed and relied upon, in deriving the characteristic curves describing earth boring cutting structures (e.g., fixed cutter drill bits, roller cone drill bits, and fixed or expandable under-reaming devices, whether concentric or eccentric in design).

One purpose of these characteristic curves is to assist in providing a solution to the Bit-Reamer Interaction question: "what are the performance capabilities of a drill bit-and-reamer combination used in real-life, and how could a given combination produce improved performance downhole?" Over the recent years this has proven an increasingly difficult question to answer whenever performing or attempting to optimize or improve performance during a simultaneous enlarging-while-drilling operation.

Without attempting to cover a transient (time-dependant) solution to this question at this point, it was decided to first identify a viable steady-state solution. In order to accommodate this and allow its integration into a stand-alone evaluation tool, not directly linked to advanced finite element analysis (FEA) style engineering platforms (capable of only analyzing each component individually) some form of characteristic curve(s) is beneficial.

This reference information may be compiled directly from the calculation results of such high-end engineering platforms, but at the same time could be derived from real-life performance data (whether they're based on historical or real-time drilling information).

While deriving this (these) characteristic curve(s) and developing a solution to the Bit-Reamer Interaction question it's beneficial to ensure the following parameters are contained within them: (a) the rotary speed, (b) the drilling weight, (c) the drilling torque, (d) the rate of penetration and (e) the compressive rock strength.

Presumably one of, if not the most well-known equations within the oilfield recently is Teale's formula defining Specific Energy[1]—the work done per volume of rock excavated, $E_s$, and the units may be given in pounds per square inch (psi). This equation is illustrated below for a drill bit:

[1]"The Concept of Specific Energy in Rock Drilling", Teale, International Journal Rock Mechanics Mining Science, 1964.

$$E_S = \frac{WOB}{A} + \frac{120 \cdot \pi \cdot RPM \cdot TOB}{A \cdot ROP}$$

where "A" is the borehole cross-sectional area and the units may be given in square inches (in²).

Since this equation is well known and accepted across the industry it appeared a good starting point in developing the required characteristic curve(s), although it did not initially cover all the required parameters.

Pessier et al.[2] further describes how Teale introduced the concept of minimum specific energy (or maximum mechanical efficiency). The minimum specific energy is reached when the specific energy approaches, or is roughly equal to, the compressive strength of the rock being drilled (meaning the maximum mechanical efficiency is achieved), i.e.,

[2]"Quantifying Common Drilling Problems with Mechanical Specific Energy and a Bit-Specific Coefficient of Sliding Friction, Pessier et al., SPE #24584, 1992.

$$E_S = E_{S_{Min}} \approx \sigma$$

thus, $$E_S = \frac{WOB}{A} + \frac{120 \cdot \pi \cdot RPM \cdot TOB}{A \cdot ROP}$$

This form of the specific energy equation now contains all the desired parameters that should ultimately be present within the characteristic curves: (a) the rotary speed, (b) the drilling weight, (c) the drilling torque, (d) the rate of penetration and (e) the compressive rock strength.

To find a suitable characteristic equation, in accordance with particular embodiments of the present disclosure, some manipulation of this equation is required. Rearranging the equation at minimum specific energy, $$A = \frac{WOB}{\sigma} + \frac{120 \cdot \pi \cdot RPM \cdot TOB}{\sigma \cdot ROP}$$

The depth of penetration per revolution is, $$d = \frac{ROP}{5 \cdot RPM}$$

Substituting into the equation for "A" gives, $$A = \frac{WOB}{\sigma} + \frac{120 \cdot \pi \cdot TOB}{\sigma \cdot 5 \cdot d}$$

reducing to, $$A = \frac{WOB}{\sigma} + \frac{24 \cdot \pi \cdot TOB}{\sigma \cdot d}$$

Further review of Pessier reveals the definition of the sliding coefficient of friction, µ, which is dimensionless:

$$TOB = \mu \cdot \frac{D \cdot WOB}{36}$$

where D is the borehole diameter and units may be expressed in inches (in).

This sliding coefficient of friction was initially introduced to express the drilling torque as a function of the drilling weight. This sliding coefficient of friction can be inserted into the equation for A:

$$A = \frac{WOB}{\sigma} + \frac{24 \cdot \pi \cdot \mu \cdot D \cdot WOB}{\sigma \cdot d \cdot 36}$$

rearranging and reducing, $$A = \frac{WOB}{\sigma}\left[1 + \frac{24 \cdot \pi \cdot \mu \cdot D}{36 \cdot d}\right]$$

$$A = \frac{WOB}{\sigma}\left[1 + \frac{2 \cdot \pi \cdot \mu \cdot D}{3 \cdot d}\right]$$

$$\frac{WOB}{\sigma} = \frac{A}{\left[1 + \frac{2 \cdot \pi \cdot \mu \cdot D}{3 \cdot d}\right]}$$

$$\text{Effective Area} = \frac{WOB}{\sigma} = \frac{A}{\left[1 + \frac{2 \cdot \pi \cdot \mu \cdot D}{3 \cdot d}\right]}$$

This equation was taken to be a suitable form for a characteristic equation in that WOB/σ could be related to something tangible (borehole cross-sectional area, A) through a non-dimensional transform (within the brackets) that was dependant on the depth of penetration per revolution, d. This relationship for WOB/σ is called the "Effective Area" and the units may be given in square inches (in²).

The value of the sliding coefficient of friction, p, and/or the value of WOB/σ can be provided by models or data for a given value of d. Thus the form of this "weight based" characteristic equation is what is important (as opposed to the equation itself) where the Effective Area is a function of d.

$$\text{Effective Area} = \frac{WOB}{\sigma} = f(d)$$

Having a characteristic curve that defines the weight on a cutting structure required to advance at a given depth of penetration per revolution, d, in a given rock strength is very useful. The equations above can be applied to any cutting structure, for example a reamer cutting structure, by replacing WOB with WOR, and TOB with TOR.

This form of the characteristic equation effectively captures four out of the five desired parameters (rotary speed, drilling weight, rate of penetration, and compressive rock strength) excepting the drilling torque. In accordance with particular embodiments, a second "torque based" characteristic equation was needed as a function of the depth of penetration per revolution, d, as well. It was noted that TOB/WOB, having units in inches (in), might be a desirable characteristic to complement WOB/σ (having units in square inches (in²)). Such a characteristic can be derived by going back to the equation for borehole area at minimum specific energy, A:

$$A = \frac{WOB}{\sigma} + \frac{24 \cdot \pi \cdot TOB}{\sigma \cdot d}$$

with further manipulation, $$A = \frac{WOB}{\sigma} + \frac{24 \cdot \pi}{d} \cdot \frac{WOB}{\sigma} \cdot \frac{TOB}{WOB}$$

$$A = \frac{WOB}{\sigma}\left[1 + \frac{24 \cdot \pi}{d} \cdot \frac{TOB}{WOB}\right]$$

$$\frac{24 \cdot \pi}{d} \cdot \frac{TOB}{WOB} = \frac{A}{\frac{WOB}{\sigma}} - 1$$

$$\frac{TOB}{WOB} = \frac{d}{24 \cdot \pi}\left[\frac{A}{\frac{WOB}{\sigma}} - 1\right]$$

For a circular borehole, $$A = \pi \cdot R^2$$

where R is the radius of the borehole and units may be given in inches (in). Thus, $$\frac{TOB}{WOB} = \frac{d}{24 \cdot \pi}\left[\frac{\pi \cdot R^2}{\frac{WOB}{\sigma}} - 1\right]$$

$$\frac{TOB}{WOB} = \frac{d}{24}\left[\frac{R^2}{\frac{WOB}{\sigma}} - \frac{1}{\pi}\right]$$

$$\text{Effective Radius} = \frac{TOB}{WOB} = \frac{d}{24}\left[\frac{R^2}{\frac{WOB}{\sigma}} - \frac{1}{\pi}\right]$$

This equation was taken to be a suitable form for a second characteristic equation in that TOB/WOB was dependant on the depth of penetration per revolution, d, and the first characteristic Effective Area (WOB/σ), which itself is dependent on the depth of penetration per revolution, d. This relationship for TOB/WOB is called the "Effective Radius" and the units may be given in inches (in). Warren[3] shows a somewhat similar relationship for torque of a roller cone bit, but the focus was on trying to use roller cone bit torque as an indicator of formation properties. The equations above can be applied to any cutting structure, for example a reamer cutting structure, by replacing WOB with WOR, and TOB with TOR.

[3]"Factors Affecting Torque for a Roller Cone Bit", Warren, SPE #11994, 1984.

Again, the form of this "torque based" characteristic equation is what is important (as opposed to the equation itself) where the Effective Radius is a function of d.

$$\text{Effective Radius} = \frac{TOB}{WOB} = f(d)$$

Collecting various datasets (containing the five mentioned parameters) allows for the determination of two characteristic trends/curves while implementing some form of curve-fitting upon them. These datasets may be generated from the previously mentioned state-of-the-art FEA-style engineering platforms for a given earth boring device, or may just as well be compiled using real-life drilling information.

These characteristic curves now define the global steady-state drilling response of an earth boring device without being required to evaluate a certain design within a high-end engineering platform and this for a limitless amount of drilling environment combinations.

Figure 2:
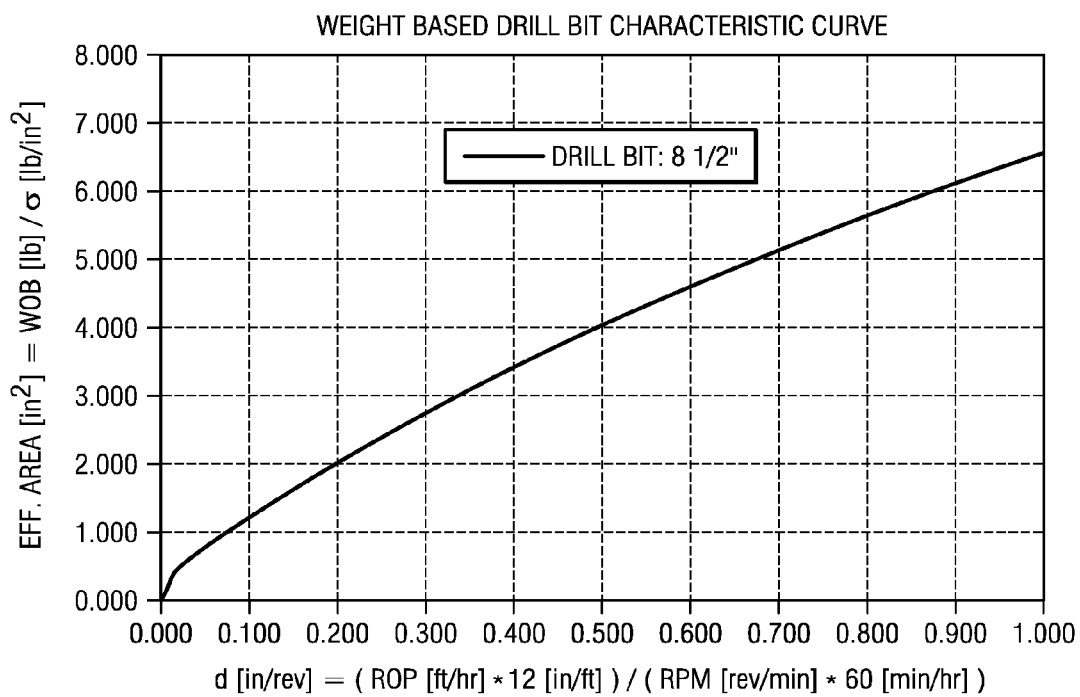
FIGS. 2-3 illustrate weight-based characteristic curves, in accordance with particular embodiments of the present disclosure.

FIG. 2 illustrates a weight based characteristic curve pertaining to a drill bit, for example drill bit 32. The characteristic curve includes a graphical depiction of the cutting structure(s) predicted performance. In the illustrated embodiment of FIG. 2, the horizontal, or x-axis reflects the depth of penetration per revolution, d (measured in inches per revolution of the drill bit). The vertical axis, or y-axis reflects the weight on bit divided by rock strength (the Effective Area). In the illustrated embodiment of FIG. 2, drill bit 32 is an eight and one-half inch drill bit. As discussed in more detail below, the data used to generate the characteristic curve of FIG. 2 may be derived from a variety of sources, including actual data, or data derived from a computer model.

Figure 3:
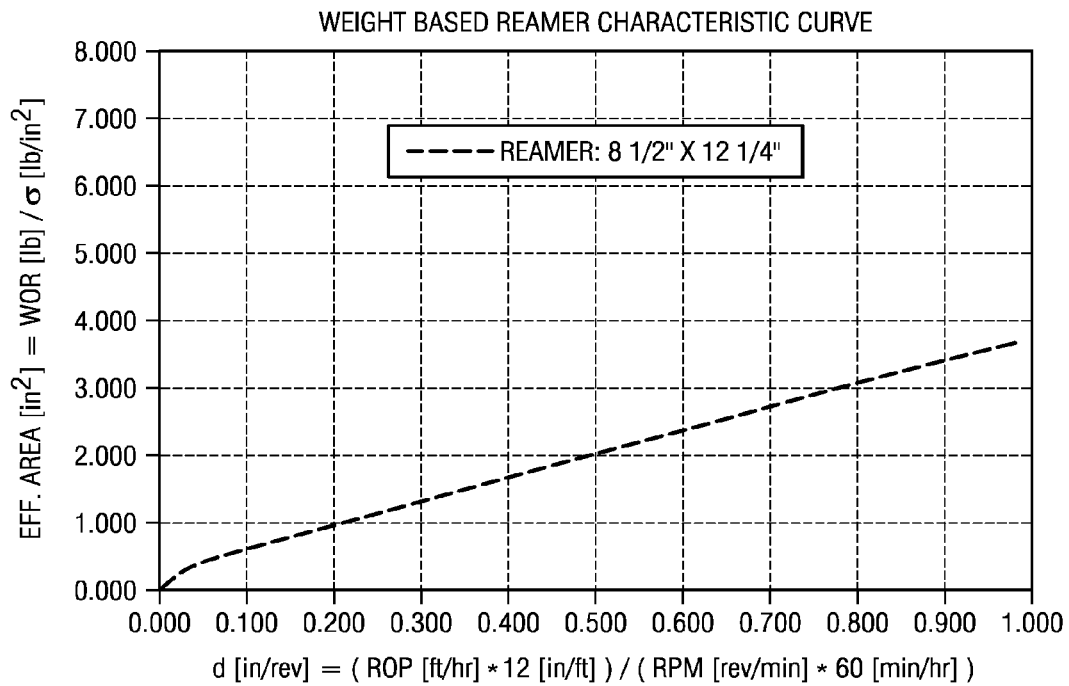

FIG. 3 illustrates a weight based characteristic curve similar to FIG. 2, except that the characteristic curve of FIG. 3 pertains to a reamer, for example reamer 34. The characteristic curve includes a graphical depiction of the cutting structure(s) performance. In the illustrated embodiment of FIG. 3, the horizontal, or x-axis reflects the depth of penetration (measured in inches) per revolution, d, of the reamer. The vertical axis, or y-axis reflects the weight on reamer divided by rock strength (the Effective Area). In the illustrated embodiment of FIG. 3, reamer 34 is an eight and one-half inch by twelve and one-quarter inch reamer.

Figure 4:
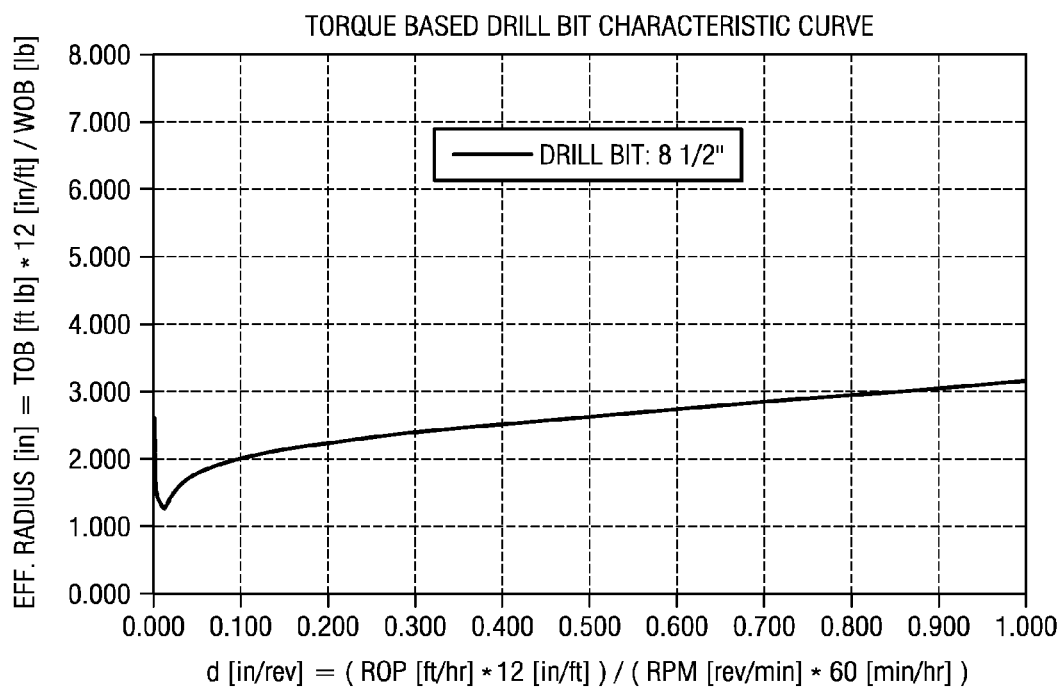
FIGS. 4-5 illustrate torque-based characteristic curves, in accordance with particular embodiments of the present disclosure.

FIG. 4 illustrates a torque based characteristic curve pertaining to a drill bit, for example drill bit 32. The characteristic curve includes a graphical depiction of the cutting structure(s) performance. In the illustrated embodiment of FIG. 4, the horizontal, or x-axis reflects the depth of penetration (measured in inches) per revolution, d, of the drill bit. The vertical axis, or y-axis reflects the torque on bit divided by weight on bit (the Effective Radius). In the illustrated embodiment of FIG. 4, drill bit 32 is an eight and one-half inch drill bit.

Figure 5:
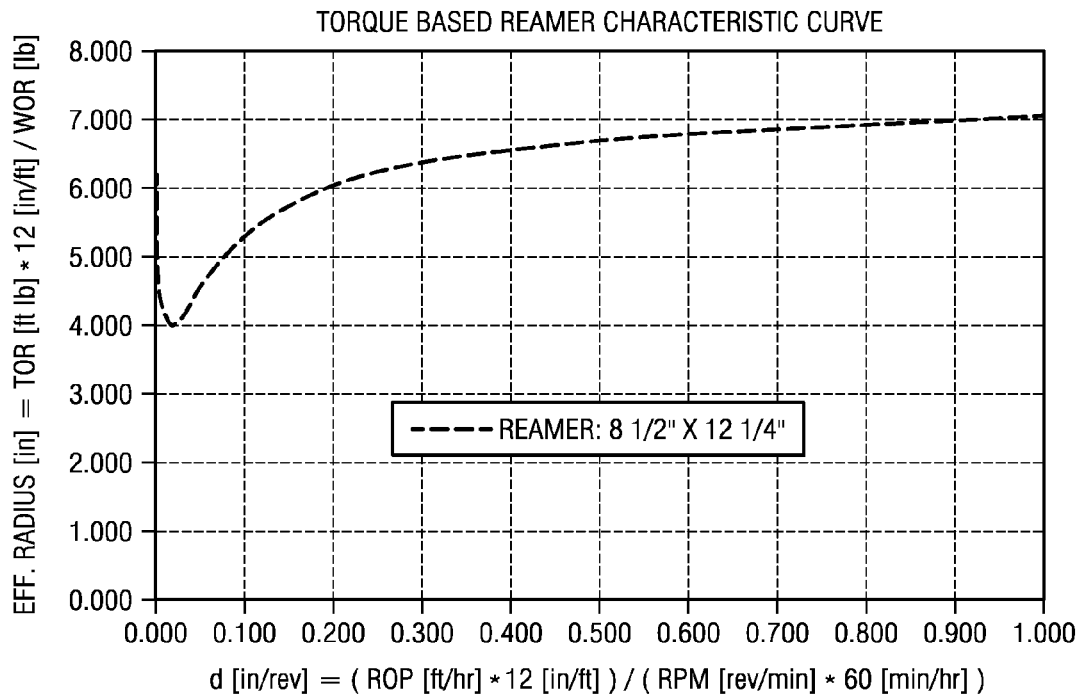

FIG. 5 illustrates a torque based characteristic curve similar to FIG. 4, except that the characteristic curve of FIG. 5 pertains to a reamer, for example reamer 34. The characteristic curve includes a graphical depiction of the cutting structure(s) performance. In the illustrated embodiment of FIG. 5, the horizontal, or x-axis reflects the depth of penetration (measured in inches) per revolution, d, of the reamer. The vertical axis, or y-axis reflects the torque on reamer divided by weight on reamer (the Effective Radius). In the illustrated embodiment of FIG. 5, reamer 34 is an eight and one-half inch by twelve and one-quarter inch reamer.

Figure 6:
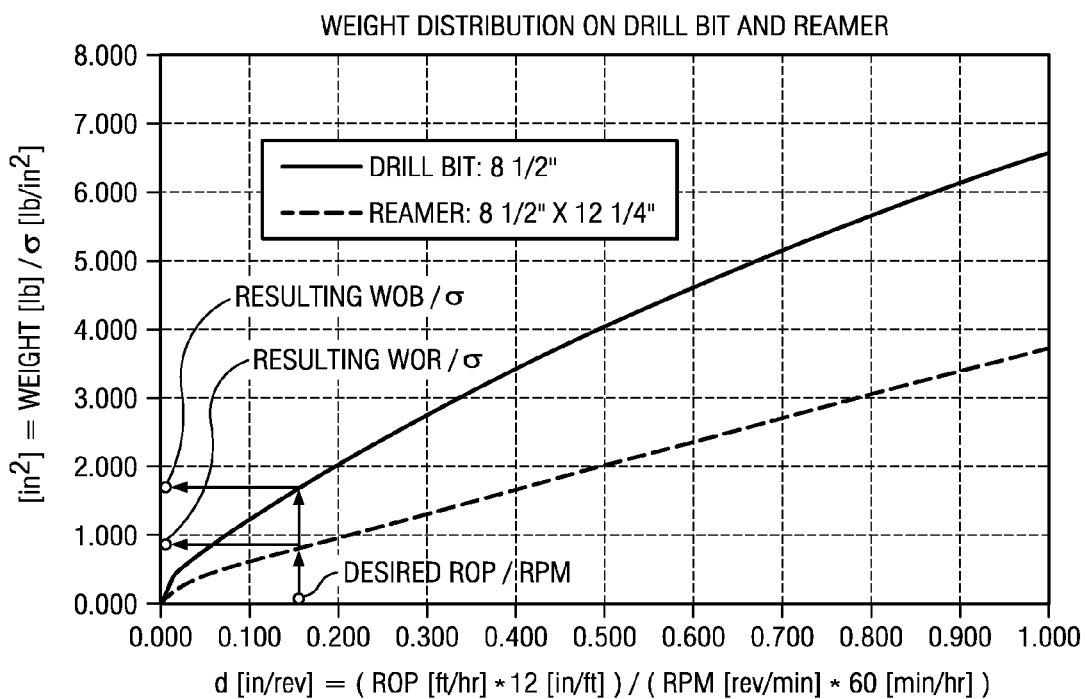
FIGS. 6-7 illustrate weight distribution graphs, in accordance with particular embodiments of the present disclosure.

According to the teachings of the present disclosure, the weight based characteristic curves for a drill bit and reamer(s) in a given BHA can be combined as illustrated in FIG. 6. As illustrated in FIG. 6, each of the drill bit and reamer characteristic curves are reflected upon a common graph, with common axes. The characteristic curve includes a graphical depiction of the cutting structures performance. In the illustrated embodiment of FIG. 6, the horizontal, or x-axis reflects the depth of penetration (measured in inches) per revolution, d, of the cutting structures (e.g., drill bit 32 and reamer 34). The vertical axis, or y-axis reflects the weight on the cutting structure (e.g., drill bit or reamer) divided by the rock strength ($\sigma$) (the Effective Area). In the illustrated embodiment of FIG. 6, drill bit 32 is an eight and one-half inch drill bit and reamer 34 is an eight and one-half inch by twelve and one-quarter inch reamer.

As depicted in FIG. 6, the combined characteristic curves allow for a user to select any desired ROP/RPM for a BHA that includes bit 32 and reamer 34, and quickly calculate (or at least approximate) the associated weight on bit/rock strength for the drill bit 32 ("Resulting WOB/$\sigma$") and the associated weight on reamer/rock strength for the reamer 34 ("Resulting WOR/$\sigma$"). The drill bit cutting structure and the reamer cutting structure may be in different lithologies with different rock strength, $\sigma$. The appropriate rock strength, $\sigma$, for each cutting structure must be used, such as $\sigma_b$ for the rock strength associated with the drill bit and a $\sigma_r$ for the rock strength associated with the reamer.

Figure 7:
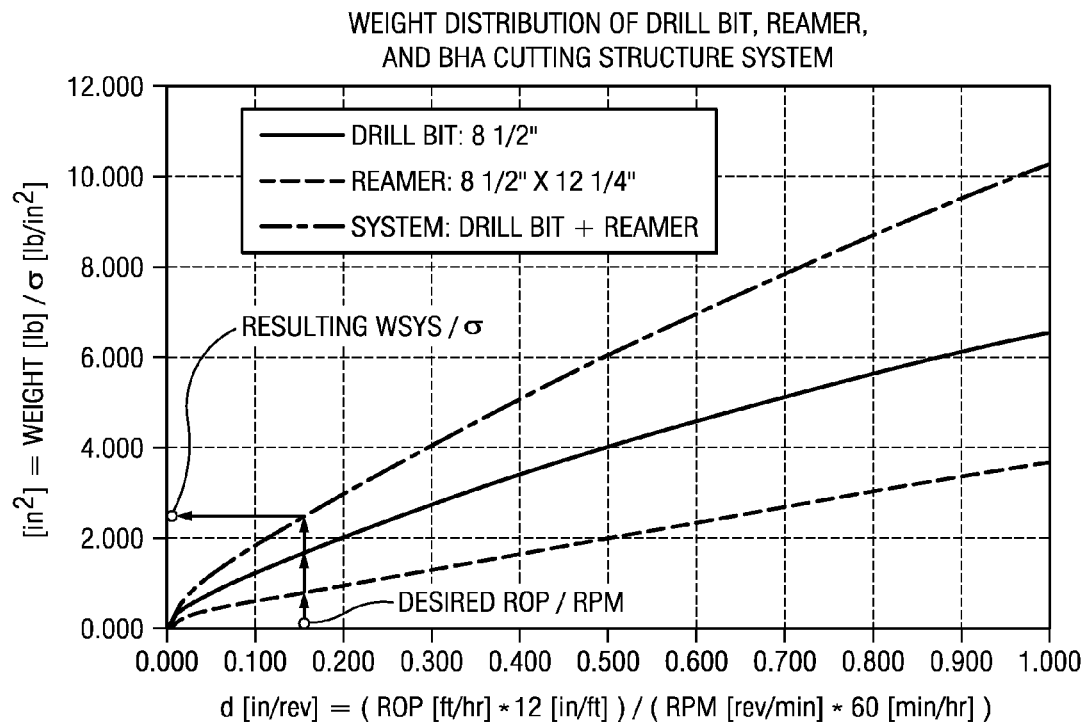

In addition, the weight based characteristic curve for the combined BHA system of a drill bit and reamer cutting structures can be generated as illustrated in FIG. 7. Similar to FIG. 6, FIG. 7 reflects the characteristic curve of drill bit 32 and reamer 34. However, FIG. 7 also includes the characteristic curve of the system (combined drill bit and reamer cutting structure characteristic curves). The characteristic curve of the system reflects the sum of the drill bit characteristic curve and the reamer characteristic curve. The system characteristic curve allows a user to determine the weight required for the system, for any desired ROP. In FIG. 7, drill bit 32 is an eight and one-half inch drill bit and reamer 34 is an eight and one-half inch by twelve and one-quarter inch reamer.

It is worth noting that two weight-based characteristic curves may only be "added" together to obtain the system curve fit, if the rock strengths that the two cutting structures are encountering are equal, or approximately equal. This is true because rock strength appears in the denominator of the y-axis of the weight based characteristic curves.

Figure 8:
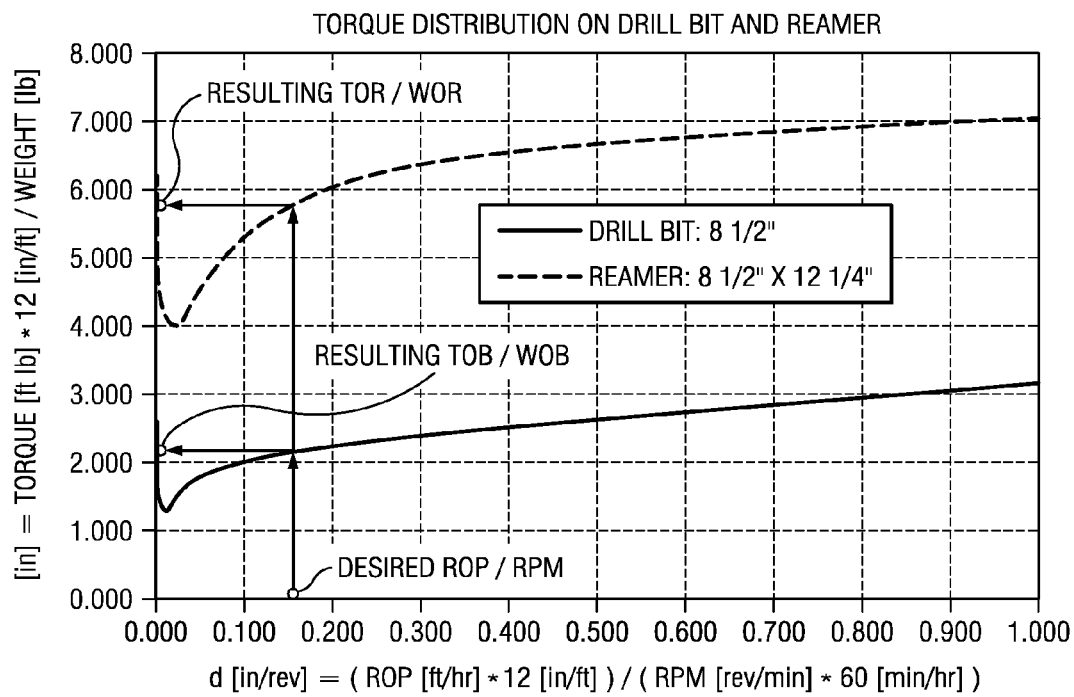
FIGS. 8-9 illustrate torque distribution graphs, in accordance with particular embodiments of the present disclosure.

In a similar manner, according to the teachings of the present disclosure, the torque based characteristic curves for a system that includes a drill bit and reamer(s) in a given BHA can be illustrated on a common graph as illustrated in FIG. 8. As shown in FIG. 8, each of the drill bit and reamer characteristic curves are reflected upon a common graph, with common axes. The characteristic curve includes a graphical depiction of the respective cutting structures performance. In the illustrated embodiment of FIG. 8, the horizontal, or x-axis reflects the depth of penetration (measured in inches) per revolution, d, of the cutting structures (e.g., drill bit 32 and reamer 34). The vertical axis, or y-axis reflects the torque on the cutting structure (e.g., drill bit 32 and reamer 34) divided by the weight on the cutting structure (the Effective Radius). In the illustrated embodiment of FIG. 8, drill bit 32 is an eight and one-half inch drill bit and reamer 34 is an eight and one-half inch by twelve and one-quarter inch reamer.

As depicted in FIG. 8, the combined characteristic curves allow for a user to select any desired ROP/RPM for a BHA that includes bit 32 and reamer 34, and quickly calculate (or at least approximate) the associated torque on bit/weight on bit for the drill bit 32 ("Resulting TOB/WOB") and the associated torque on reamer/weight on reamer for the reamer 34 ("Resulting TOR/WOR").

Figure 9:
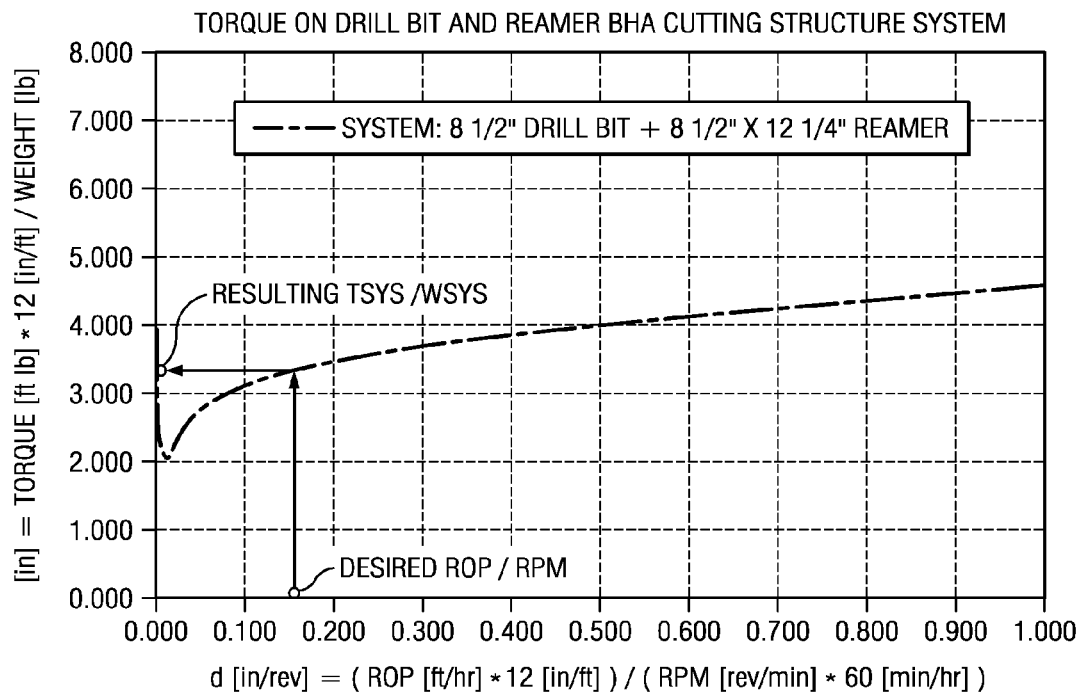

Likewise, a torque based characteristic curve for the combined BHA system (including the drill bit 32 and reamer 34 cutting structures) can be generated as illustrated in FIG. 9.

The y-axis of this curve represents TSYS/WSYS and the x-axis is the depth of penetration per revolution, d, that has been consistently used in all the characteristic curves. Thus, values from the previous characteristic curves can be combined as follows at a given ROP/RPM and rock strength, σ, to achieve the desired characteristic:

$$\frac{\frac{TOB \times 12}{WOB} \times \frac{WOB}{\sigma} + \frac{TOR \times 12}{WOR} \times \frac{WOR}{\sigma}}{\frac{WOB + WOR}{\sigma}} =$$

$$\frac{(TOB + TOR) \times 12}{WOB + WOR} = \frac{TSYS \times 12}{WSYS}$$

where TOB, TOR, and TSYS units are [ft lb]; WOB, WOR, and WSYS units are [lb]; and σ units are [psi]. Other units can be applied as well as long as appropriate conversion factors are used.

It is often desired to know the BHA system applied weight, WSYS, (e.g., in FIG. 7) required to drill at a desired ROP (in a given rock at a desired RPM) as well as the distribution of that BHA system applied weight to the cutting structures in the BHA. Since the drill bit and reamer(s) in a BHA have the same nominal ROP, the combined characteristic curves make it easier to see how the weight distribution and torque distribution between drill bit and reamer(s) cutting structures must exist to sustain that ROP in a given rock and RPM.

The sum of the weights that are distributed to each of the cutting structures equals the weight applied on the system of cutting structures, according to the following equation:

WSYS [lb]=WOB [lb]+WOR(s) [lb]

Likewise, the sum of the torques generated by each of the cutting structures equals the torque generated by the system of cutting structures, according to the following equation:

TSYS [ft lb]=TOB [ft lb]+TOR(s) [ft lb]

A weight based characteristic curve for the BHA system of cutting structures can be generated by simply adding together the curves for each cutting structure (see e.g., FIG. 7 that combines a drill bit weight based characteristic curve and a reamer weight based characteristic curve, into a system weight based characteristic curve). However, the same is not true of the torque based characteristic curves. Torque based characteristic curves cannot be added together in the same way as weight based characteristic curves, because the measure of weight in the denominator is different between the two (i.e., weight on reamer and weight on bit are not equal).

Combined characteristic curves reflect the individual weight on bit and weight on reamer(s) that correspond to a desired drilling ROP (in a given rock and desired RPM) as well as the weight on the system WSYS of drill bit and reamer cutting structures in the BHA that correspond with a desired ROP. Likewise, the combined characteristic curves show the individual torque on bit and torque on reamer(s) generated by the individual weight on bit and weight on reamer(s) at the desired ROP (in a given rock and desired RPM).

It is worth noting that the RPM of the cutting structures in a BHA may be different (but are typically the same). For example, a given BHA may include a mud motor between the drill bit and reamer, that may drive the drill bit cutting structure at a higher RPM than the reamer cutting structure. In this embodiment, the reamer may be driven at the drill pipe RPM directly from the drilling rig at surface. In this case, nominal ROP will still be the same for each cutting structure, but ROP/RPM, hence the depth of penetration per revolution, d, will be different for the different cutting structures. The cutting structure turning at a higher RPM has to have a lower value of d in order to progress at the same ROP as another cutting structure in the same BHA turning at a lower RPM. The individual characteristic curves for each cutting structure are still valid in this case but the system curves are not, since the RPM in the respective denominators are not equal.

Figure 10:
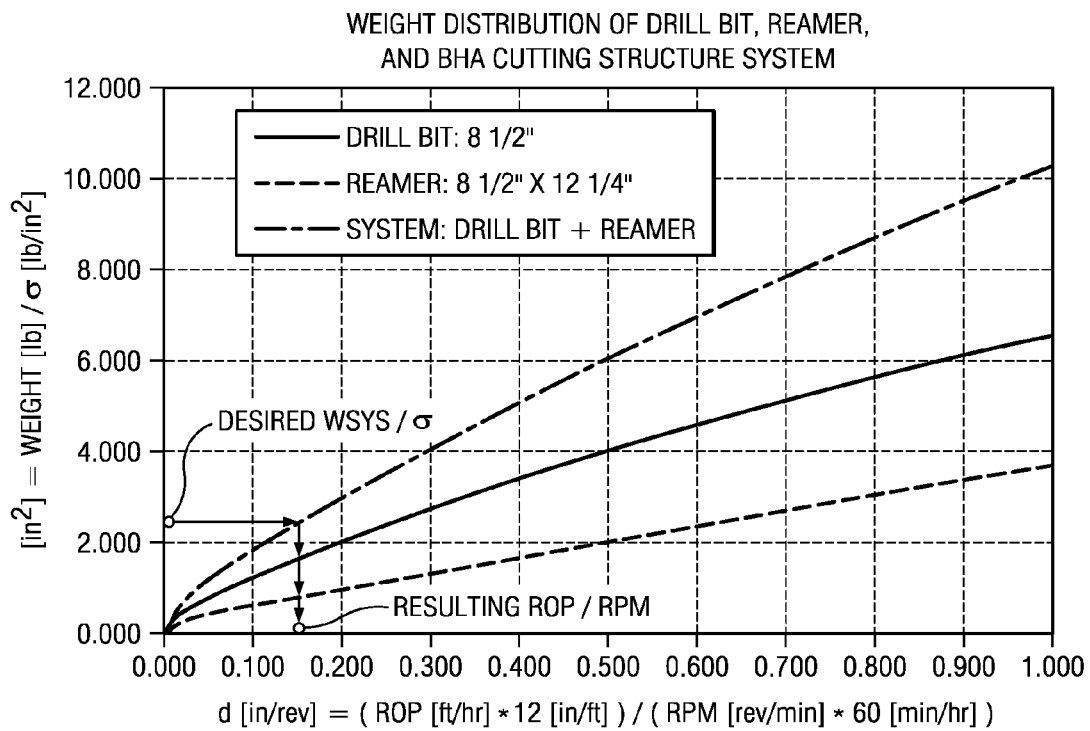
FIG. 10 illustrates a weight distribution graph, in accordance with particular embodiments of the present disclosure.

In lieu of, or in addition to determining the BHA system applied weight/rock strength (WSYS/σ) required to drill at a desired ROP, it may be desirable to determine the ROP that can be achieved with a given available WSYS. Here the system level curve is valuable to find the ROP that can be sustained by a given WSYS (in a given rock and desired RPM). See for example, FIG. 10. Once the system ROP is determined, the weight and torque distributions can be obtained as before along with the system torque TSYS.

Figure 11:
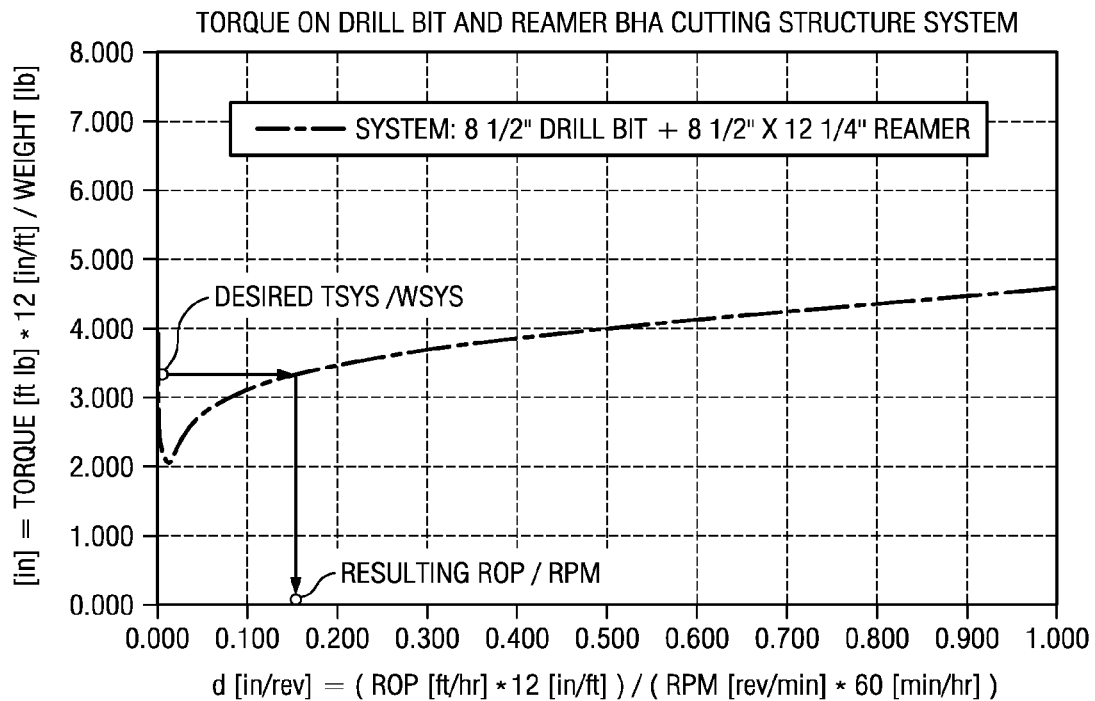
FIG. 11 illustrates a torque distribution graph, in accordance with particular embodiments of the present disclosure.
Figure 12A:
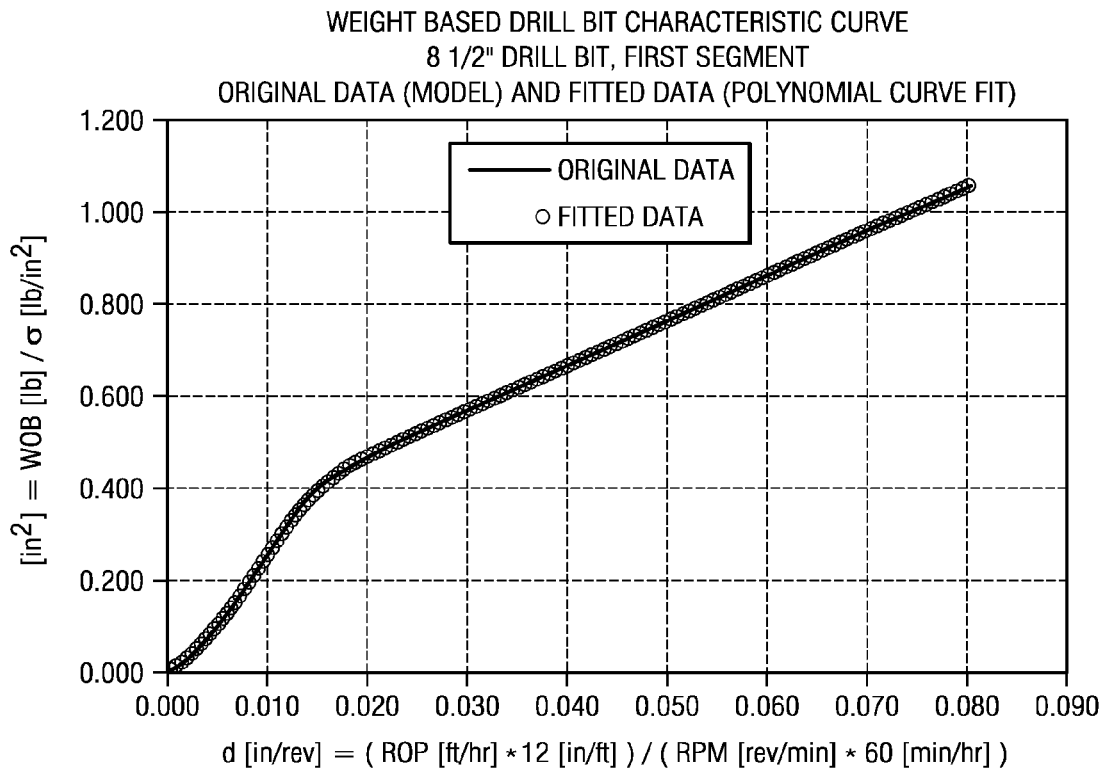
FIGS. 12a-12h illustrate characteristic curves, in accordance with particular embodiments of the present disclosure.
Figure 12B:
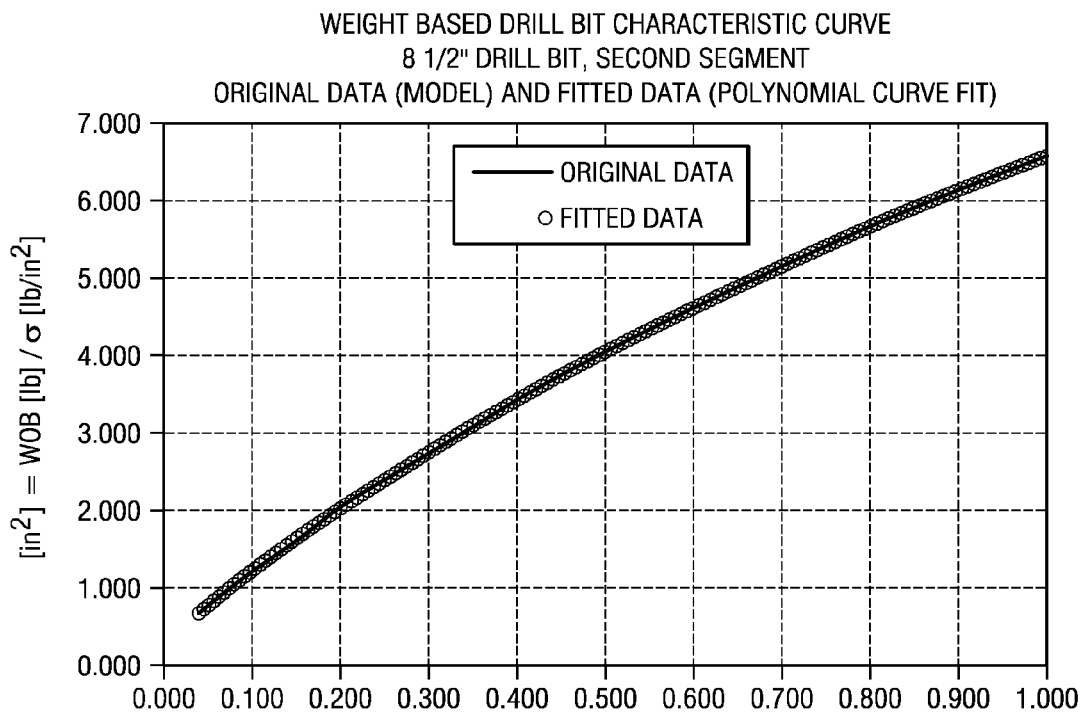
Figure 12C:
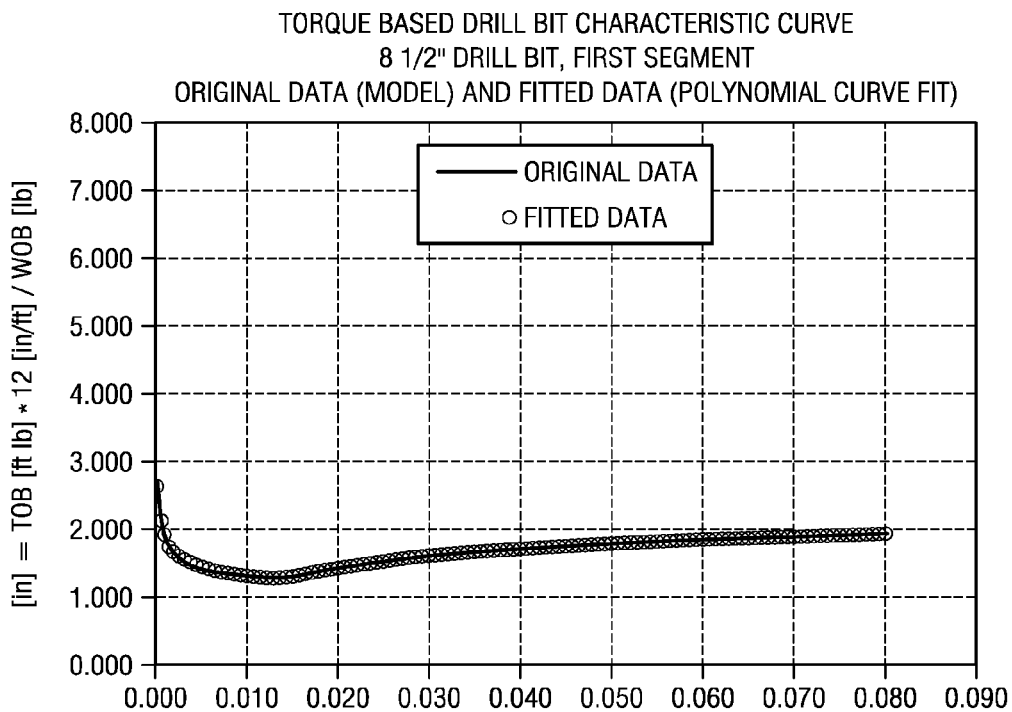
Figure 12D:
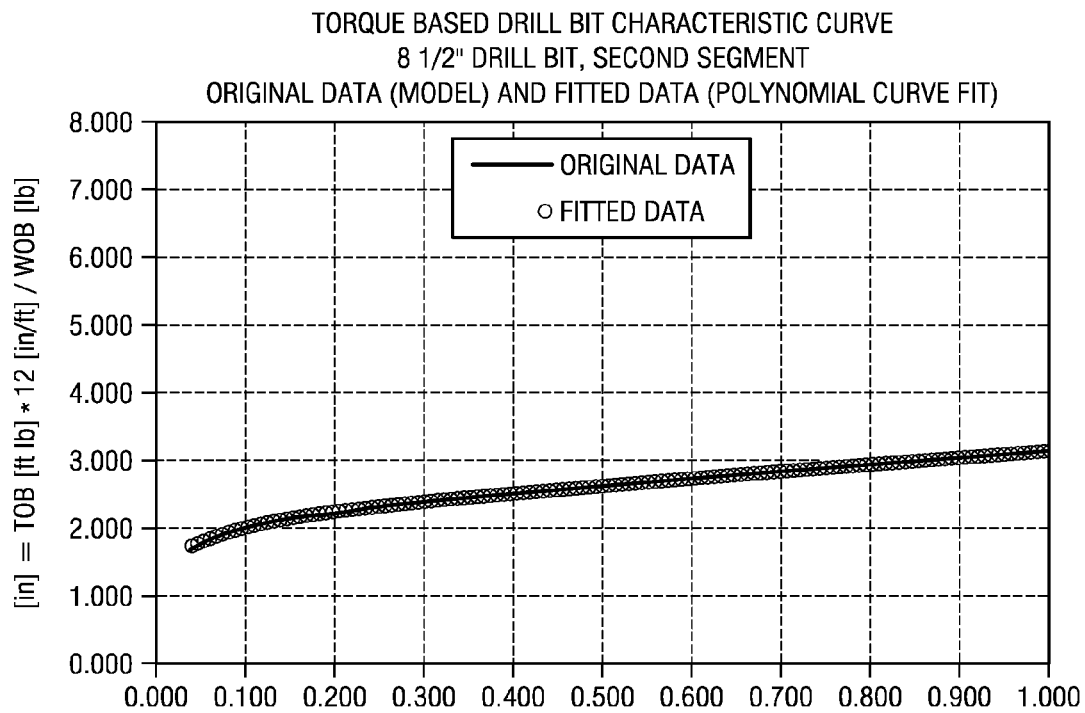
Figure 12E:
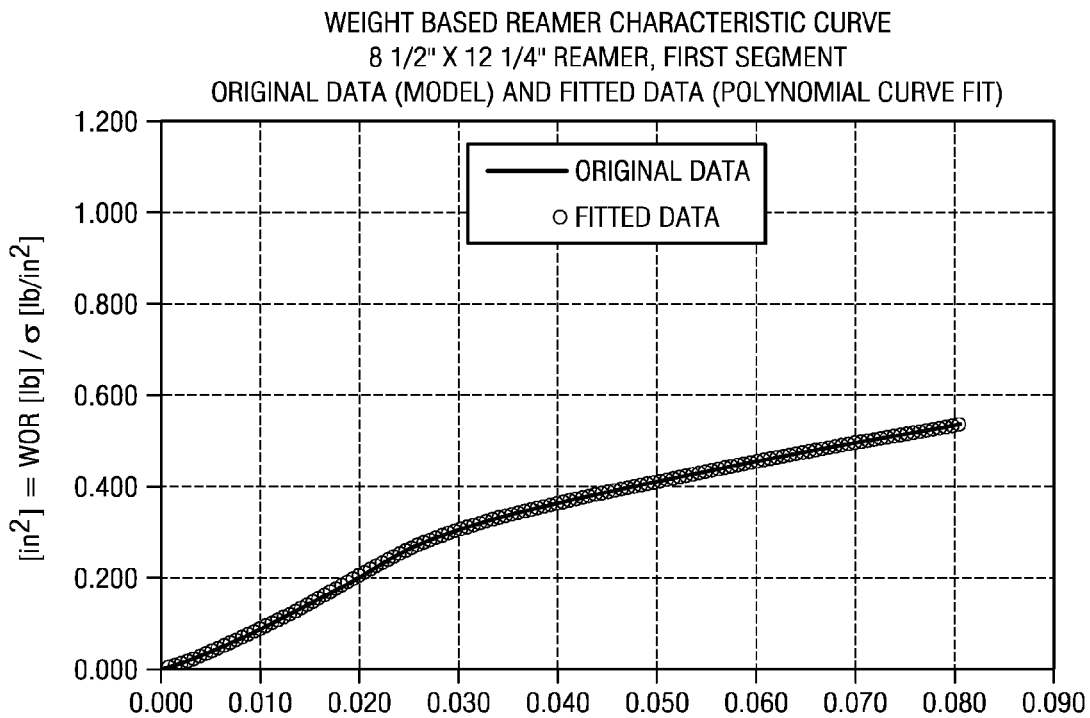
Figure 12F:
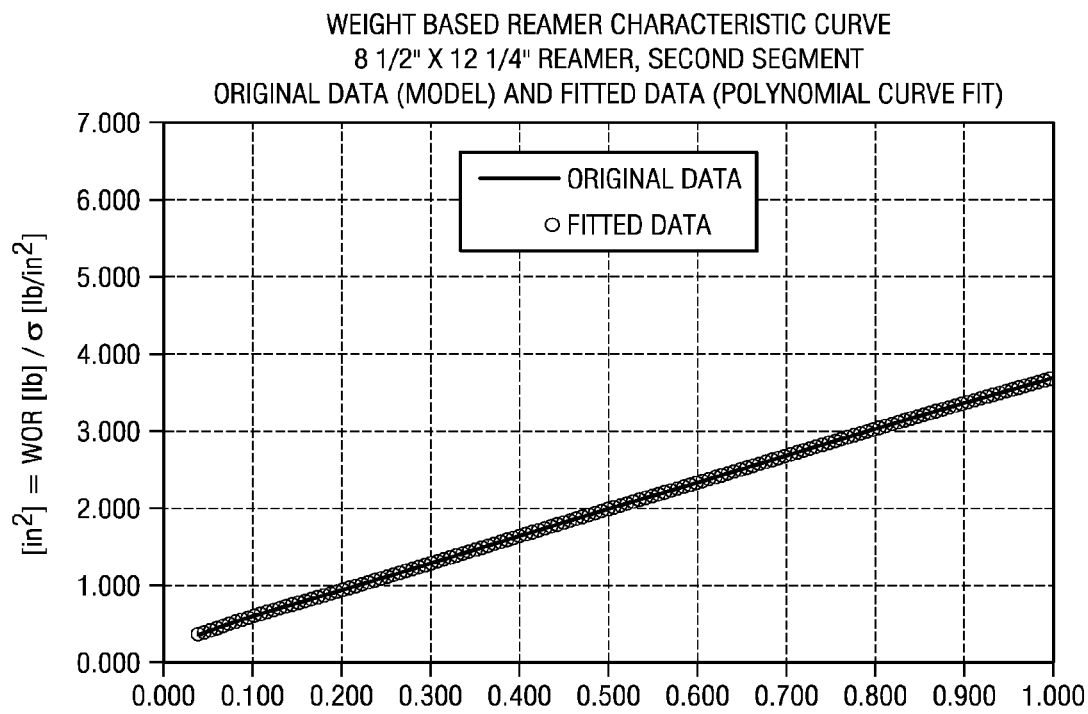
Figure 12G:
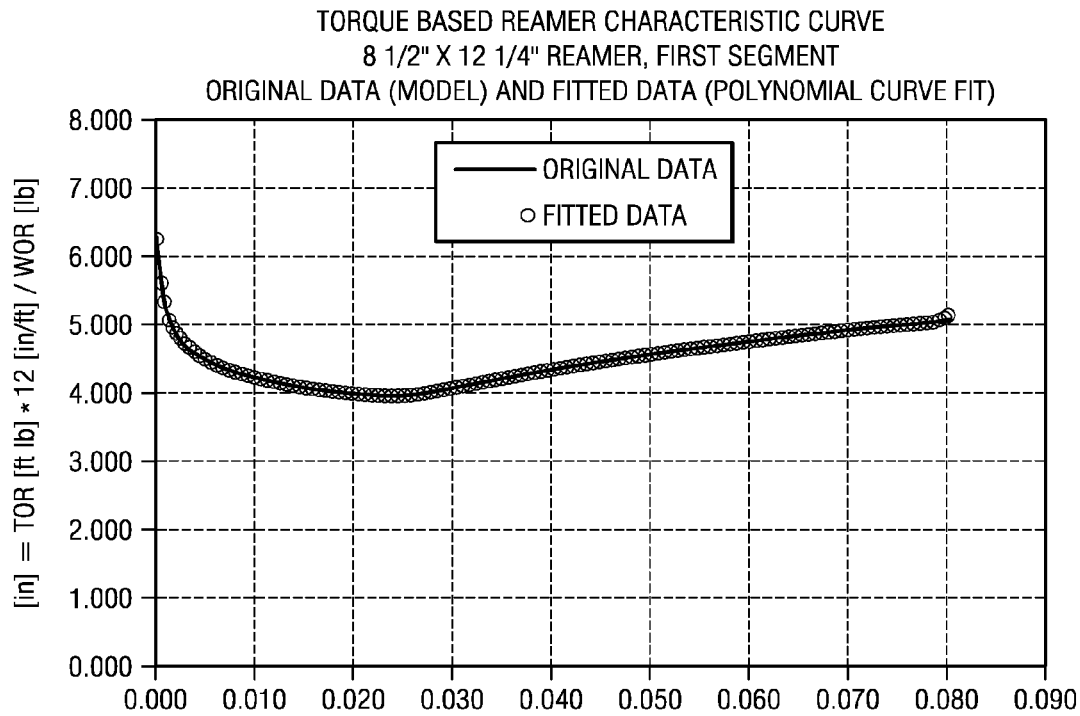
Figure 12H:
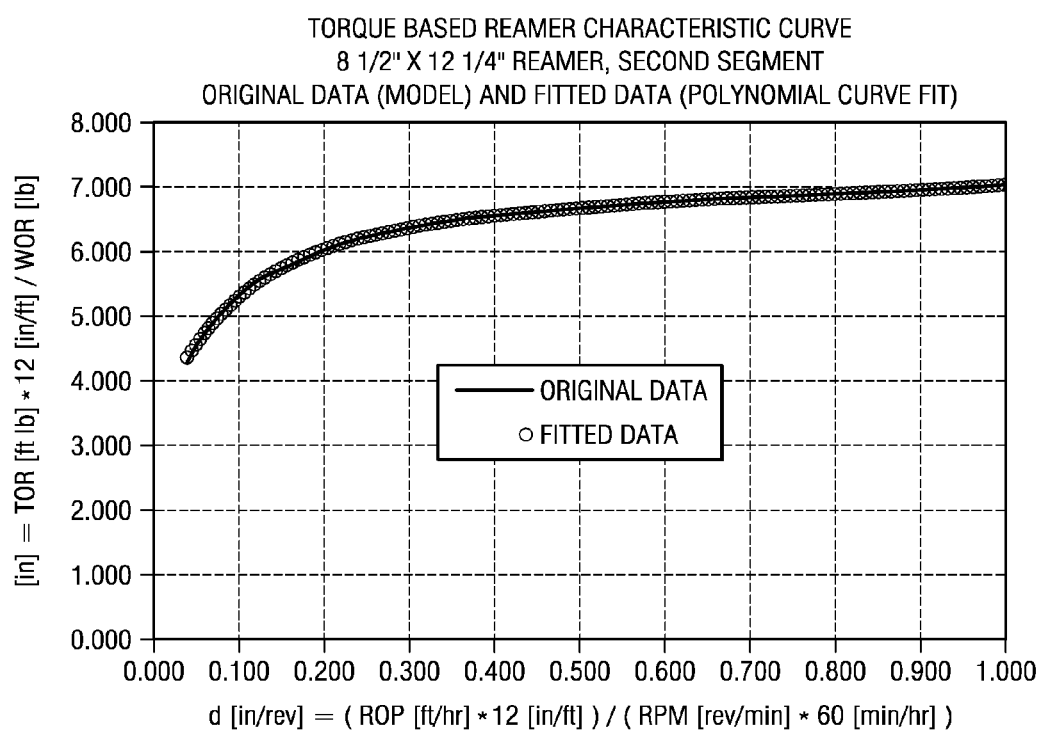

Likewise, it may be desired to determine the ROP that can be achieved with a given desired limit of system torque TSYS. Again, the system level curve is valuable to find the ROP that can be sustained at a given level of TSYS (in a given rock and desired RPM and WSYS). See for example, FIG. 11. After the system ROP is determined, the weight and torque distributions can be obtained as described above.

Constraints other than weight on cutting structure, torque on cutting structure, rate of penetration and rotary speed may also be used in the evaluation and/or selection process, in accordance with other embodiments of the present disclosure. For example, a maximum or minimum WOB constraint may be used to determine the maximum or minimum ROP (in a given rock and desired RPM). From the ROP, weight and torque distributions as well as required system weight and generated torque can be determined. Similar constraints can be used for a reamer(s). Still another constraint may include maximum or minimum depth of penetration per revolution, d [in/rev] (the x-axis in the characteristic curves).

In yet another embodiment of the present disclosure, a new cutting structure may be designed to approximate a desired characteristic curve. For example, it may be desirable to utilize a given reamer cutting structure that has a certain characteristic curve. It may also be desirable to design a new drill bit cutting structure with a characteristic curve that closely matches the reamer, so that the reamer and drill bit require similar WOR and WOB to drill through a given rock formation. Other design goals may include: maintaining a certain desired ratio of WOR and WOB or TOR and TOB; maintaining desired WOR and WOB when the reamer and drill bit are in different formations.

The characteristic curves for each cutting structure can be generated using existing models of their performance. Models of cutting structure performance through a given rock lithology and drilling parameters are common. For example, models generated by computer systems employing the IBitS™ and IReamS software (available from Halliburton) may be used to generate, in whole or in part, or to supplement characteristics curves, according to the teachings of the present disclosure. However, other sources of generating characteristic curves are available, and described in more detail below.

Characteristic curves for drill bit and reamer cutting structures can be obtained from a variety of sources including, but not limited to: (i) computer models of the cutting structures (e.g., IBitS™, IReamS); (ii) downhole measurements of WOB, WOR, TOB, TOR, RPM, σ (porosity measurement used to determine σ), and pressure (as it affects σ); (iii) surface measurements of ROP, RPM, WSYS, TSYS, and mud density; (iv) publicly available competitor supplied information (spec sheets, marketing material, white papers, etc); (v) customer supplied information; (vi) combinations of models and actual measurements; (vii) models and/or measurements that vary with use through cutter wear; or (viii) real time generation of characteristic curves.

Downhole measurements previously taken of WOB, WOR, TOB, TOR, RPM, σ, and pressure (as it affects rock strength) from logging while drilling (LWD) tools exist and can be used to help generate "actual" characteristic curves. ROP (a necessary component) is typically measured at surface. RPM is also typically measured at surface but can also be measured downhole with LWD tools. Such "actual" characteristic curves can be used to compare to, and improve model generated curves, and can also be added to a database of performance data, for reference as current or offset well data.

Surface measurements of ROP, RPM, WSYS, TSYS, and mud density (downhole pressure) can also be used to generate, in whole or in part, or supplement the generation of characteristic curves, and to validate/improve model generated curves.

Often, drill bit manufacturers will not disclose enough detail to allow third party modeling of a cutting structure directly (e.g., via IBitS™ or IReamS). However, if the manufacturer provides performance data such as ROP vs. WOB, or ROP vs. WOR, for a given RPM and rock strength, characteristic curves can be constructed. Specification sheets that are published by such manufacturers may provide such information. Performance data regarding a particular manufacturer's drill bits, reamers, etc., may also be derived from downhole and surface measurements as described above. Similarly, customers and potential customers may provide performance data of a particular manufacturer's drill bits or reamers sufficient to generate characteristic curves.

Combinations of models and measurements can also be utilized to generate characteristic curves. Often the measurements can be used to refine models.

As cutters on a drill bit or reamer cutting structure wear, the performance of the cutting structure, and hence the characteristic curves, will change. These changes are difficult to predict, although models that attempt to do so, exist. Field data may be more accurate with regard to the measurement of declining performance. Characteristic curves can be generated for worn cutting structures and calibrated to the amount of wear. In this manner, such characteristic curves may be utilized to predict/improve performance of the cutting structures, over time and use.

"Real-time" data (collected on site during drilling operations) may also be used to generate characteristic curves while drilling, in order to see how performance changes over time, or lithology, or drilling parameters. These changes can be used to recommend different operating parameters or to pull a drill bit or reamer from the well once performance has degraded beyond an acceptable level.

There are a number of sources available for collecting performance data, and there is a large number of drill bits and reamers to be evaluated (a user will benefit if hundreds, or even thousands of drill bits and/or reamers are evaluated and compared) for a specific drilling operation. In order to allow for an accurate calculation of the characteristic curve of a given cutting structure, a curve fit is calculated that accurately reflects the performance data, or values of performance. In accordance with a particular embodiment, the values of performance may include weight on cutting structure and/or torque on cutting structure. In a particular embodiment, the curve fit may be a polynomial curve fit.

In order to allow comparisons of many configurations at a time, as well as for speed of calculation, polynomial curve fits of the characteristic curves are performed and only the coefficients of the polynomial are stored in the cutting structure database (along with additional information for each drill bit and reamer cutting structure). Thus, thousands of drill bit cutting structures may be stored in the database, and evaluated rapidly for a given drilling operation.

In the illustrated embodiments, the characteristic curves are two-dimensional, and reflect certain values of performance (weight or torque on cutting structure) versus rate of penetration per revolution. However, it will be recognized by those of ordinary skill in the art that other embodiments may employ three dimensional (e.g., a "Z-axis") or four dimensional (e.g., time varying), in accordance with the teachings of the present disclosure.

In accordance with a particular embodiment of the present disclosure, up to a 20th degree polynomial (21 parameters) may be used as a curve fit to reflect the weight based and torque based characteristic curves (see e.g., FIGS. 12a through 12h). FIGS. 12a through 12d illustrate a weight based (two segment) and a torque based (two segment) drill bit curve fit. FIGS. 12e through 12h illustrate a weight based (two segment) and a torque based (two segment) reamer curve fit, in accordance with particular embodiments of the present invention.

In a particular embodiment, a model such as IBitS (for bits) or IReamS (for reamers) is used to calculate values of data points on the characteristic curves ("original" y-values). To enhance accuracy at low values of depth of penetration per revolution, d, characteristic curves are generated in two overlapping segments. The first segment of each characteristic curve is generated using 201 data points, from d=0.00025 [in/rev] to d=0.08025 [in/rev] (inclusive) in increments of d of 0.00040 [in/rev]. To accomplish this, the models are run with rotary speed of 120 [rpm] and rock strength of 18,000 [psi] while incrementing the ROP from 0.15 [ft/hr] to 48.15 [ft/hr] (inclusive) in increments of 0.24 [ft/hr].

The second segment of each characteristic curve is generated using 201 data points from d=0.04000 [in/rev] to d=1.00000 [in/rev] (inclusive) in increments of d of 0.00480 [in/rev]. To accomplish this, the models are run with rotary speed of 120 [rpm] and rock strength of 18,000 [psi] while incrementing the ROP from 24.00 [ft/hr] to 600.00 [ft/hr] (inclusive) in increments of 2.88 [ft/hr]. It is important to note that the calculated values of d up to 1.0 [in] may exceed what is physically possible. But calculating values of d over such a large range enables the computational iterations described later to occur in a smooth manner.

The two segments overlap for values of d between 0.04000 [in/rev] and 0.08025 [in/rev] (inclusive). Polynomial curve fits are calculated for each segment and the coefficients of the polynomials are stored in the database of characteristic curves for each cutting structure. In the application of the program, the polynomial coefficients of the first segment of each characteristic curve are used for values of d less than 0.06 [in/rev]. When values of d are greater than or equal to 0.06 [in/rev], the polynomial coefficients of the second segment of each characteristic curve are used. In this manner, curve fitting errors that occur near the ends of the polynomial curve segments do not impact the results in this overlap region.

At each increment, for the weight based characteristic curve of a drill bit, original values of WOB/σ and depth of penetration per revolution, d, (derived from the RPM and ROP values) are calculated. A polynomial curve fit is performed on each of two described above. The details of the polynomial curve fit process are described later.

At each increment, for the torque based characteristic curve of a drill bit, original values of TOB/WOB and depth of penetration per revolution, d, (derived from the RPM and ROP values) are calculated. A polynomial curve fit is performed on each of two segments, each segment containing 201 data points, as described above. The details of the polynomial curve fit process are described later.

At each increment, for the weight based characteristic curve of a reamer, original values of WOR/σ and depth of penetration per revolution, d, (derived from the RPM and ROP values) are calculated. A polynomial curve fit is performed on each of two segments, each segment containing 201 data points as described above. The details of the polynomial curve fit process are described later.

At each increment, for the torque based characteristic curve of a reamer, original values of TOR/WOR and depth of penetration per revolution, d, (derived from the RPM and ROP values) are calculated. A polynomial curve fit is performed on each of two segments, each segment containing 201 data points as described above. The details of the polynomial curve fit process are described later.

In all these particular embodiments, the polynomial curve fit of each segment of each characteristic curve is performed by first recentering and rescaling the x-axis (depth of penetration per revolution, d) values of the original data points for better numerical properties of the curve fit. The x-axis values are transformed (recentered and rescaled) into x' values as follows:

$$x' = \frac{x - dAv}{Std\ d}$$

where dAv is the average of the 201 values of depth of penetration per revolution, d, and Std d is the standard deviation of the 201 values of depth of penetration per revolution, d.

Then a conventional least squares polynomial curve fit is applied to the 201 data points of each segment of each characteristic curve to determine the coefficients of the polynomial. An example of this polynomial curve fit can be found in the "polyfit" function of commercially available technical computing software MATLAB® available from The MathWorks™. The degree, "n", of the polynomial of each segment of each characteristic curve is chosen as follows to achieve the desired level of accuracy:

for the first segment (0.00025≤d [in/rev]≤0.08025) for drill bit cutting structures, the weight based (WOB/σ) characteristic curve segment utilizes a $15^{th}$ degree polynomial (16 coefficients);

for the second segment (0.0400≤d [in/rev]≤1.0000) for drill bit cutting structures, the weight based (WOB/σ) characteristic curve segment utilizes a $15^{th}$ degree polynomial (16 coefficients);

for the first segment (0.00025≤d [in/rev]≤0.08025) for drill bit cutting structures, the torque based (TOB/WOB) characteristic curve segment utilizes a $20^{th}$ degree polynomial (21 coefficients);

for the second segment (0.0400≤d [in/rev]≤1.0000) for drill bit cutting structures, the torque based (TOB/WOB) characteristic curve segment utilizes a $20^{th}$ degree polynomial (21 coefficients);

for the first segment (0.00025≤d [in/rev]≤0.08025) for reamer cutting structures, the weight based (WOR/σ) characteristic curve segment utilizes a $13^{th}$ degree polynomial (14 coefficients);

for the second segment (0.0400≤d [in/rev]≤1.0000) for reamer cutting structures, the weight based (WOR/σ) characteristic curve segment utilizes a $13^{th}$ degree polynomial (14 coefficients);

for the first segment (0.00025≤d [in/rev]≤0.08025) for reamer cutting structures, the torque based (TOR/WOR) characteristic curve segment utilizes a $20^{th}$ degree polynomial (21 coefficients);

for the second segment (0.0400≤d [in/rev]≤1.0000) for reamer cutting structures, the torque based (TOR/WOR) characteristic curve segment utilizes a $20^{th}$ degree polynomial (21 coefficients).

For the 201 original data points of each segment of each characteristic curve, the x-axis values are set equal to the depth of penetration per revolution, d. For any given value of x, x' is calculated to rescale and recenter the values of x by:

$$x' = \frac{x - dAv}{Std\ d}$$

For each value of x, hence x', an associated original y-value is known. The coefficients of the polynomial curve fit are determined using the data set (x', y) of the 201 original data points of each segment of each characteristic curve. The coefficients of the polynomial curve fit are determined using mathematical routines equivalent to the polyfit function from MATLAB®.

"Fitted" y-values, y', can be calculated using the coefficients applied to the x' values:

$$y' = A0 + A1x' + A2x'^2 + A3x'^3 + \ldots Anx'^n$$

where y' is the calculated fitted result (WOB/σ, TOB/WOB, WOR/σ, TOR/WOR) for any given x, hence x'; and Ao, A1, A2, A3 . . . An are the coefficients of an nth degree polynomial for the appropriate segment of the characteristic curve at the desired degree n.

For error checking purposes, this fitted series of values can be compared to the corresponding original series of values to determine if the polynomial curve fit adequately represents the original characteristic curve. A least squares fit comparison is performed between the original data series and the new fitted values whereby a coefficient of correlation R is determined as:

$$R = \frac{m\sum_{i=1}^{m} y_i y'_i - \left(\sum_{i=1}^{m} y_i\right)\left(\sum_{i=1}^{m} y'_i\right)}{\left[m\sum_{i=1}^{m} y_i^2 - \left(\sum_{i=1}^{m} y_i\right)^2\right]^{\frac{1}{2}} \left[m\sum_{i=1}^{m} y'^2_i - \left(\sum_{i=1}^{m} y'_i\right)^2\right]^{\frac{1}{2}}}$$

where m is the number of data values in a series, for example 201; $y_i$ is the original y-value (WOB/σ, TOB/WOB, WOR/σ, TOR/WOR) from the model of $i^{th}$ data point in the series of m data points; and $y'_i$ is the fitted y-value (WOB/σ, TOB/WOB, WOR/σ, TOR/WOR) calculated from the polynomial curve fit. The coefficient of correlation R is squared to obtain the coefficient of determination.

In a particular embodiment, the coefficient of determination $R^2$ should be preferably greater than or equal to 0.9998 for the polynomial curve fit to have an acceptable error condition.

A visual indication of the suitability of the polynomial curve fit with coefficient of correlation R as described above can be seen in FIG. 12a through FIG. 12h where the fitted y' values are plotted on top of the characteristic curve through the original y values.

Moreover, other curve fits could be used, within the teachings of the present disclosure. For example, linear, power law, logarithmic, and/or exponential curve fits may be used to calculate, or store the characteristic curve fit(s).

It will be appreciated by those having ordinary skill in the art, that many cutting structure configurations are possible in a BHA. In accordance with the teachings of the present invention, performance of cutting structures can be compared across all combinations and permutations of (i) drill bit; (ii) reamer; (iii) drill bit plus reamer; (iv) drill bit plus multiple reamers; and/or multiple reamers. For example, a single drill bit can be compared against another drill bit, but a single drill bit can also be compared against another drill bit plus reamer configuration. Moreover, drill bit and reamer performance can be compared across different sizes and types. It may be desirable to compare up to thousands of combinations at a time to find the best performing solution across a range of lithology and drilling parameters and evaluated against a set of constraints.

The teachings of the present invention allow a user to collect and analyze data regarding thousands of drill bits and/or reamer cutting structures. As discussed above, in accordance with a particular embodiment, such data may be stored in a cutting structure database of characteristic curve fit polynomial coefficients. Thus, a system and method are provided to quickly and easily (i) choose candidate cutting structures and/or cutting structure combinations, (ii) compare their performance in a given scenario of lithology and drilling parameters, and/or (iii) select the best configurations through the use of a Performance Index.

Figure 26:
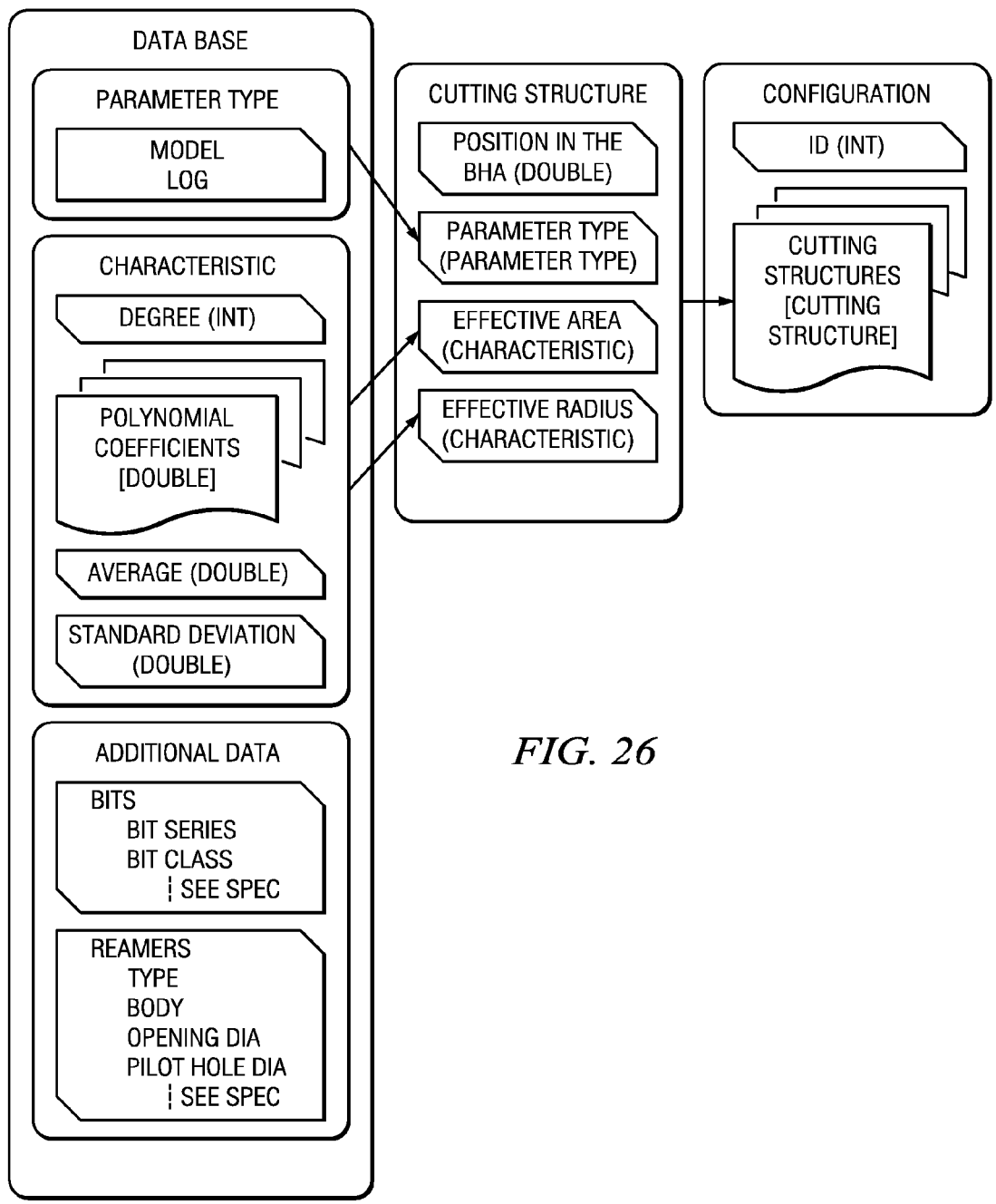
FIGS. 26-27 illustrate particular embodiments of flow charts describing an algorithm(s) that may be used in accordance with a particular embodiment of the present disclosure.
Figure 27:
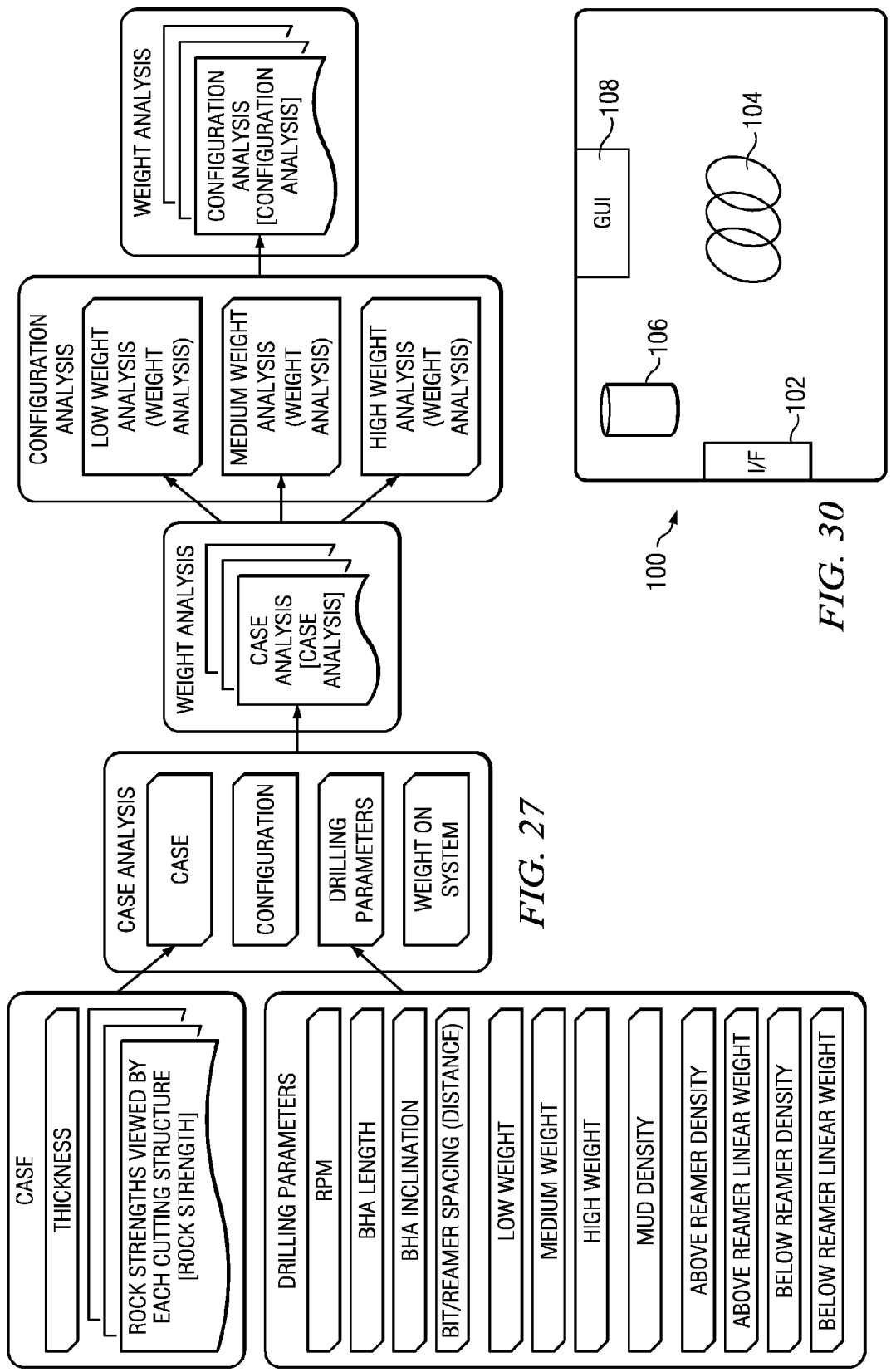

In accordance with a particular embodiment of the present invention, a computer algorithm allows a user to accomplish these tasks. FIG. 26 and FIG. 27 illustrate a particular embodiment flow chart of the algorithm. The data base of characteristic curve fit polynomial coefficients is represented in FIG. 26 in the boxes labeled CHARACTERISTIC, PARAMETER TYPE, and ADDITIONAL DATA. CHARACTERISTIC holds: the polynomial coefficients of each segment of each characteristic curve as well as the degree of the polynomial, n, for each segment; dAv, the average of the 201 values of depth of penetration per revolution for each segment; and Std d, the standard deviation of the 201 values of depth of penetration per revolution for each segment. PARAMETER TYPE stores information about whether the polynomial coefficients were generated from a model or from a log of performance from an actual bit run. ADDITIONAL DATA stores additional identifying information about the cutting structures such as: (for drill bits) Bit Series, Bit Class, Bit Application, Bit Technology, Bit Blade Count, Bit Cutter Size, Bit Profile Shape, Bit Diameter, Bit Chamfer Type, Bit Chamfer Size, Bit Material Number, Bit Type, Bit Cutting Structure Number, etc.; (for reamers) Type, Body, Opening Diameter, Pilot Hole Diameter, Arm Count, Blade Count, Layout, Cutter Size, Material Number, Project Name, etc. The utility of this additional information in selecting cutting structures for analysis is discussed below.

Figure 13:
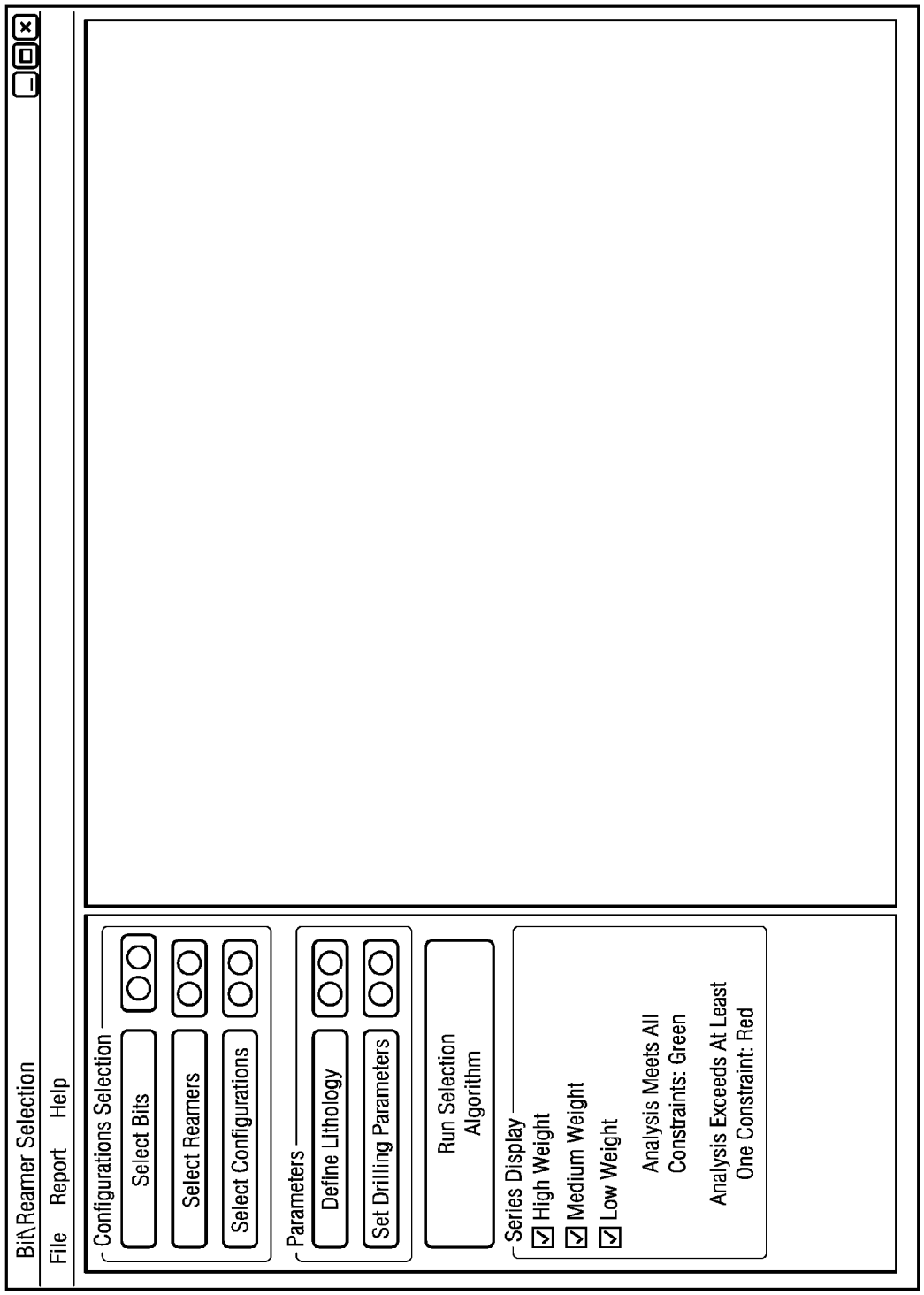

FIG. 13 illustrates a screen shot of a computer program that may be employed to select bits, reamers, other cutting structures, or combinations thereof, in accordance with a particular embodiment of the present disclosure. The "initial screen" of FIG. 13 allows a user to select an operation to perform, including: (i) Select Bits; (ii) Select Reamers; (iii) Select Configurations; (iv) Define Lithology; (v) Set Drilling Parameters; and/or (vi) Run Selection Algorithm.

Figure 14:
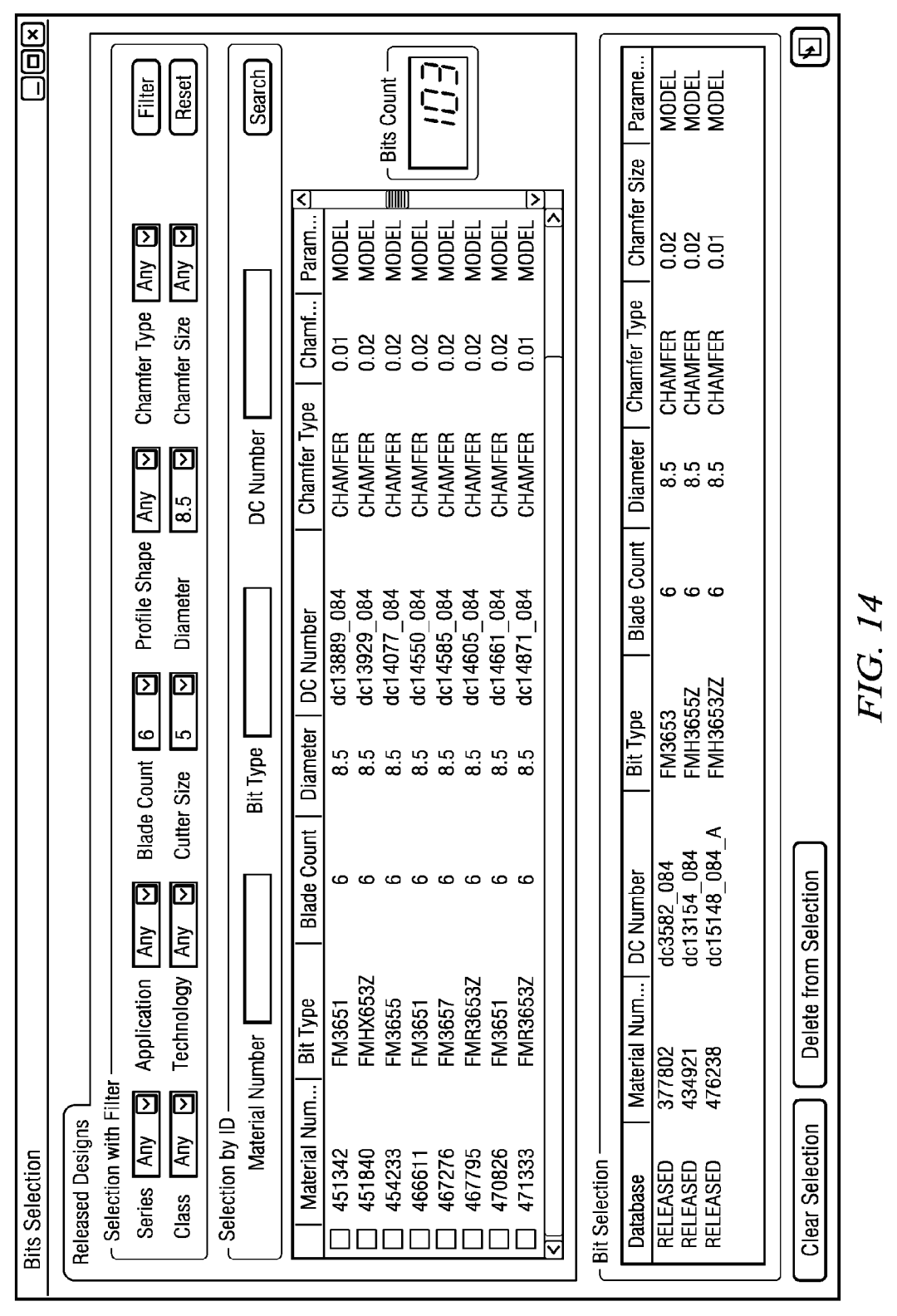

FIG. 14 illustrates a bit selection screen that allows a user to apply filters regarding various features of the drill bit in order to filter out less suitable drill bits for the given operation. The drill bit selection screen allows a user to select and/or identify potential drill bits by Bit Series, Bit Class, Bit Application, Bit Technology, Bit Blade Count, Bit Cutter Size, Bit Profile Shape, Bit Diameter, Bit Chamfer Type, Bit Chamfer Size, Bit Material Number, Bit Type, Bit Cutting Structure Number, etc. In the example of FIG. 14, such filters effectively reduced the number of drill bits under consideration to one hundred and three. The computer program also allows the user to select one or more of the one hundred and three drill bits to be used in later calculations. As illustrated in FIG. 14, the user selected three such drill bits for further consideration. The portion of the computer algorithm corresponding with the functionality shown in FIG. 14 is shown in FIG. 26 in the box labeled CUTTING STRUCTURE where cutting structures are selected for further analysis.

FIG. 15 illustrates a reamer selection screen that allows a user to apply filters regarding various features of the reamer in order to filter out less suitable reamers for the given operation. The reamer selection screen allows a user to select and/or identify potential reamers by Type, Body, Opening Diameter, Pilot Hole Diameter, Arm Count, Blade Count, Layout, Cutter Size, Material Number, Project Name, etc. For example, one filter is the pilot hole diameter that will normally be selected to match bits that were previously selected. This allows the user to filter out less suitable reamers for the given operation. In the example of FIG. 15, filters effectively reduced the number of reamers under consideration to eleven. The computer program also allows the user to select one or more of the eleven reamers to be used in later calculations. As illustrated in FIG. 15, the user selected two such reamers for further consideration. These two reamers have different opening diameters to allow the user to evaluate different opening diameters in the system. The portion of the computer algorithm corresponding with the functionality shown in FIG. 15 is shown in FIG. 26 in the box labeled CUTTING STRUCTURE where cutting structures are selected for further analysis.

The selected bits and reamers may then be displayed in a list along with as many as every valid combination/permutation. The user can select individual bits, individual reamers, combinations of drill bit and reamer, or every bit, every reamer, and every combination for analysis.

FIG. 16 allows the user to select the configurations to be evaluated. All possible configurations of bits, reamers and bits plus reamers from the previous selections of bits and reamers are displayed to the user. In the illustrated embodiment, the user selects only the bit plus reamer configurations for further analysis. The portion of the computer algorithm corresponding with the functionality shown in FIG. 16 is shown in FIG. 26 in the box labeled CONFIGURATION where cutting structures and cutting structure combinations are selected for further analysis. The selected items are called "configurations."

Figure 29:
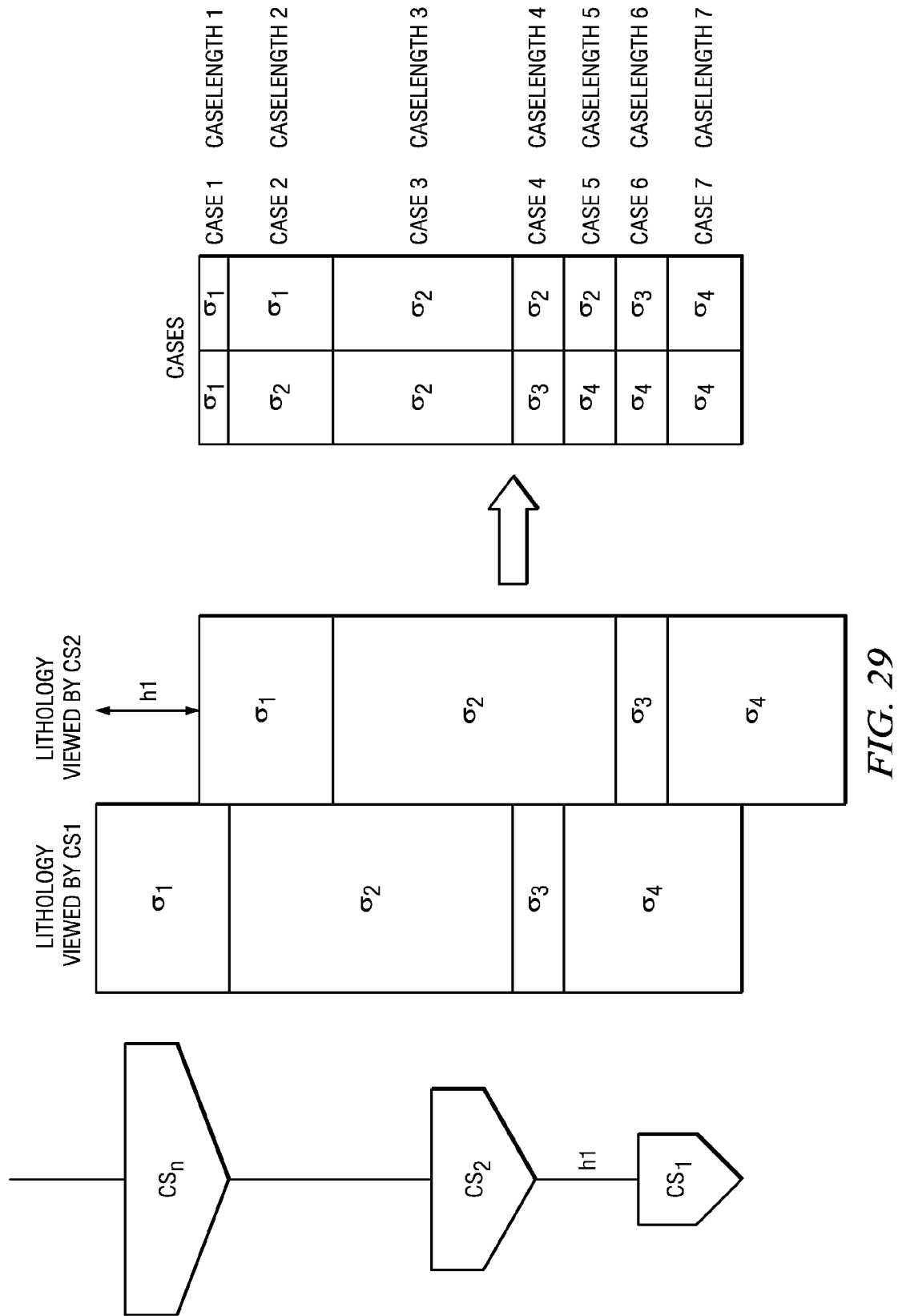
FIG. 29 illustrates representations of a BHA, varying lithology and an illustrations of the "cases" encountered by the BHA, in accordance with a particular embodiment of the present disclosure.

FIG. 17 illustrates a screen shot from the computer program that allows the user to define the lithology to be drilled. In accordance with this embodiment, zones may be defined by depth, length and rock strength. Any number of zones may be defined to reflect the lithology of the formation to be drilled. During normal drilling operations, the drill bit and reamer cutting structures on a BHA encounter different lithologies (represented by rock strength) at different times because the cutting structures exist at different locations along the BHA. The left figure of FIG. 29 shows a representation of a BHA where $CS_1$ is a drill bit cutting structure, $CS_2$ is a reamer cutting structure at distance h1 above the drill bit, and $CS_n$ represents additional reamer cutting structures if present in the BHA. The middle figure of FIG. 29 shows adjacent views of the lithology encountered by the drill bit and reamer at the same points in time as the well is drilled in the downward direction. The drill bit $CS_1$ encounters each new rock strength $\sigma_1$, $\sigma_2$, $\sigma_3$, $\sigma_4$ before the reamer $CS_2$. The analysis of bit and reamer(s) performance starts when all cutting structures are in a defined lithology (the uppermost reamer cutting structure just touching the top of the uppermost defined lithology). In FIG. 29, the analysis starts when the drill bit is a distance h1 below the top of rock strength $\sigma_1$ and the reamer is at the top of rock strength $\sigma_1$. At this time both the drill bit and reamer are within the same rock strength $\sigma_1$ which defines CASE 1 in the analysis shown on the right figure of FIG. 29. As the BHA drills further down the lithological column, the drill bit cutting structure encounters new rock strength $\sigma_2$ before the reamer cutting structure. This defines a new case, CASE 2, in the analysis where the drill bit is in rock strength $\sigma_2$ and the reamer is still in rock strength $\sigma_1$. Drilling further in this example, the reamer encounters rock strength $\sigma_2$ while the drill bit is still in rock strength $\sigma_2$ which defines CASE 3. Every time one of the cutting structures in the BHA encounters a new rock strength, a new case is defined. Each case has a thickness or length (CASELENGTH) associated with it from the depth where one cutting structure encounters a new rock strength to the depth where any of the cutting structures encounters a new rock strength. In the example in FIG. 29, the four rock strengths and two cutting structures at a distance h1 apart define seven cases for analysis. In general, the last case terminates when the drill bit reaches the bottom of the lowermost defined lithology. The portion of the computer algorithm corresponding with the functionality shown in FIG. 17 and FIG. 29 is shown in FIG. 27 in the box labeled CASE where the lithology is entered in the program and parsed into "cases" for further analysis and the length or thickness of each case is calculated and stored.

Figure 18:
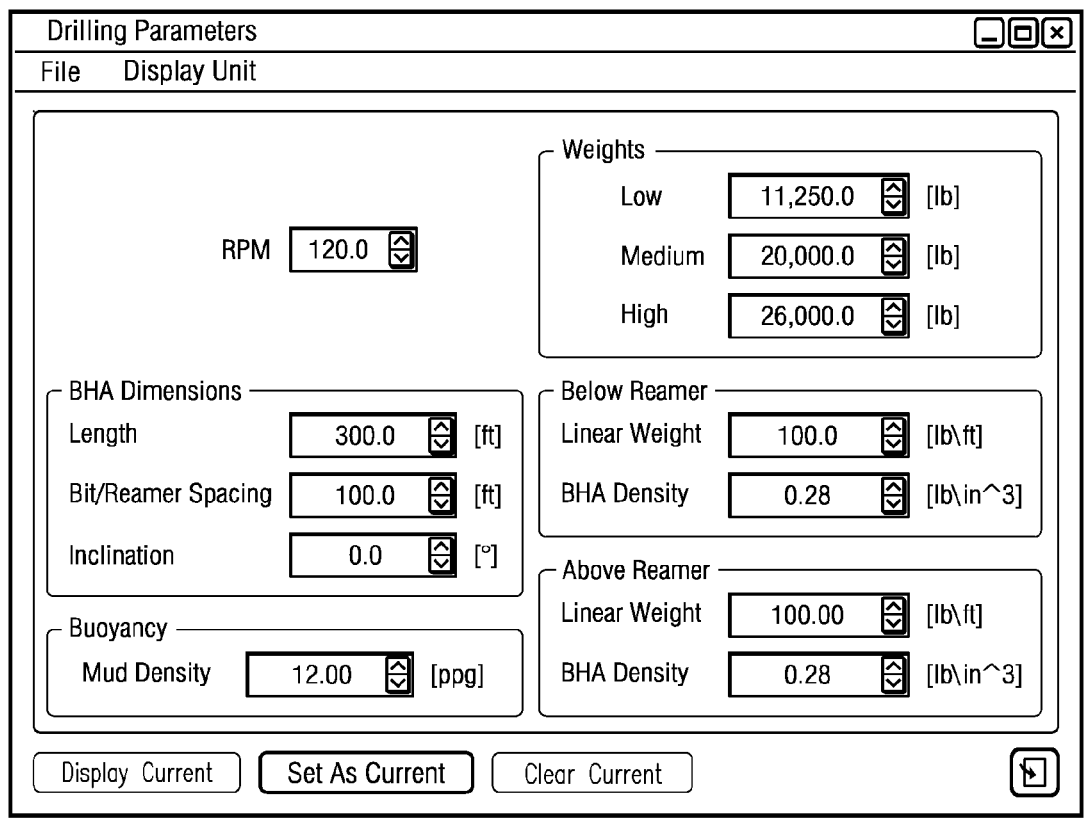

FIG. 18 illustrates a screen shot from the computer program that allows the user to define drilling parameters to be used. In accordance with this embodiment, a user may define the RPM, and certain dimensions of the BHA, including the length, bit\reamer spacing (necessary for defining "cases" of lithology as well as neutral point locations), and inclination. Using the inclination, the buoyancy effect of the drilling mud on the BHA for neutral point calculations can be calculated with the inputs of mud density, linear weight of the BHA and BHA material density below the reamer, and linear weight of the BHA and BHA material density above the reamer. Neutral point will be discussed later in more detail. Low, medium and high weights on system (WSYS) can be defined by the user to calculate three different performances indexes as described later. The weight on system is the drilling weight applied to the system of cutting structures in the BHA. This weight is typically supplied by the weight of drill collars in the BHA. The buoyant weight of the entire drill string (less friction and reaction between the drill string and the well) including the drill collars is supported by the hookload of the drilling rig at surface when the cutting structures are not engaged with the formation. By the action of the drilling rig lowering the cutting structures into engagement with the formation and drilling, some of the weight of the BHA is transferred to the cutting structures and reacted by the rock at those cutting structures, reducing the hookload by the same amount. This reduction in hookload is the weight applied to the system of cutting structures. If a drill bit or reamer is the only cutting structure in the BHA, all of the weight on system is applied to the drill bit or reamer. If a reamer(s) is added to the BHA above the drill bit, the weight on system is shared between the cutting structures. One of the primary aims of the computer program of the particular embodiment is to determine the distribution of the weight on system to the cutting structures that exist in the BHA. The portion of the computer algorithm corresponding with the functionality shown in FIG. 18 is shown in FIG. 27 in the box labeled DRILLING PARAMETERS.

Constraints may be built into the algorithm for every cutting structure, and may include: (i) Minimum WOB; (ii) Maximum WOB; (iii) Maximum torque on drill bit connection; (iv) Minimum WOR; (v) Maximum WOR; (vi) Maximum torque on reamer body; (vii) Maximum Depth of Penetration Per Revolution (drill bit and reamer); and/or (viii) Minimum Depth of Penetration Per Revolution (drill bit and reamer).

In accordance with the teachings of the present disclosure, the computer program performs an analysis to calculate a Performance Index for each BHA cutting structure "configuration" that is representative of the aggregate performance through all "cases" of all the lithology increments at the specified RPM at each WSYS. The Performance Index for each configuration, set of cases, and WSYS may be represented by a symbol on a chart. In accordance with a particular embodiment, each configuration will show three symbols in a vertical column, one each for Low WSYS (lowest), Medium WSYS (middle), and High WSYS (highest). Many configurations may be displayed together, column by column. It will often be the case, that many of the symbols are red as they violate at least one constraint for at least one case. It is possible that only a few green symbols may exist; these can be compared and are candidates for further study and potential selection for use in a BHA. Each configuration may consist of one or more cutting structures. The Performance Index is used to compare them all together.

In the illustrated embodiment, three WSYS levels are used to generate three values of Performance Index for each configuration, but more or fewer WSYS levels can potentially be used, even real time WSYS in a real time analysis while drilling. In the illustrated embodiment, the Performance Index is set equal to the calculated overall ROP of the configuration through the lithology at the given RPM at each WSYS. ROP may be calculated using the characteristic curves for each cutting structure through an iterative process. The portion of the computer algorithm where ROP is calculated is shown in FIG. 27. Here a "weight analysis" is performed for each case, configuration and WSYS. In the weight analysis, the weight from WSYS that is distributed to each cutting structure (e.g. WOB, WOR) in the BHA is determined such that the depth of penetration per revolution, d, is the same for all cutting structures in the BHA. Knowing the value of d that satisfies this condition, the ROP can be easily determined along with duration of drilling. For a given WSYS and configuration, the duration of drilling for all the cases can be summed, with the lowest duration having the highest overall ROP through all the cases. This overall ROP is equated to the Performance Index.

Figure 28:
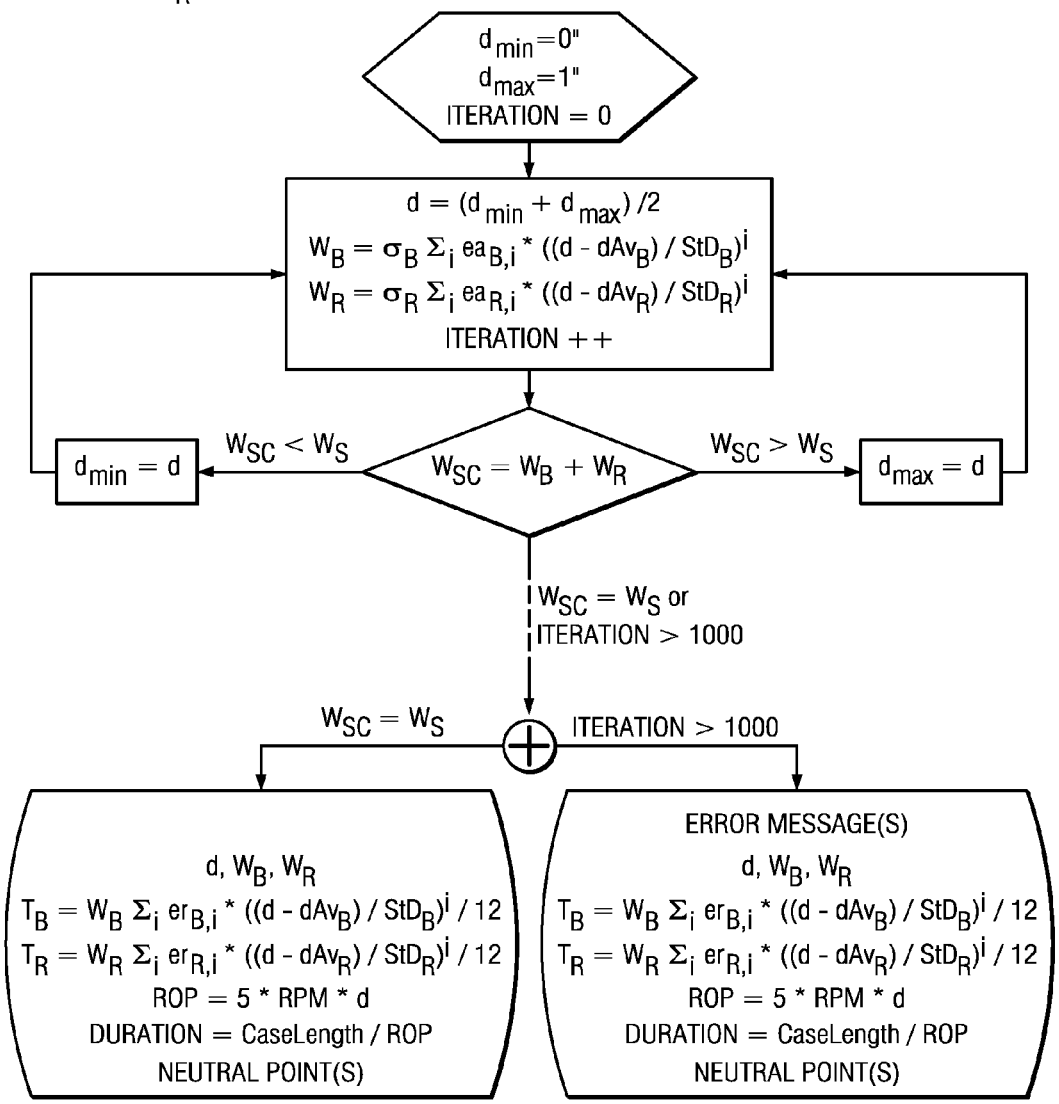
FIG. 28 illustrates an iterative process(es) that may be used in the calculation of a characteristic curve, in accordance with particular embodiments of the present disclosure.

The details of this iterative process are shown in FIG. 28. The characteristic curves for the cutting structures in a given BHA are defined over a range of depth of penetration per revolution, d, from dmin equals 0.00025 inches per revolution to dmax equals one inch per revolution, in two segments. The initial starting point of the iterative process is the average of dmin=0 [in/rev] and dmin=1.0 [in/rev], or d=0.5 [in/rev] (where d=(dmin+dmax)/2). Recall that d is the x-axis of the weight based characteristic curve and that the x-axis of each segment of the characteristic curve has been recentered and rescaled through the use of dAv and Std d. Recall also that WOB/σ is the y-axis of the weight based characteristic curve for a drill bit and WOR/σ is the y-axis of the weight based characteristic curve for a reamer. Recall also that the coefficients (A0, A1, A2, . . . An) of a polynomial curve fit for each segment of each characteristic curve are stored in a database of cutting structure characteristic curves along with dAv and Std d for each segment of each characteristic curve. Thus, to calculate weight on a cutting structure at a given value of d the algorithm only needs to know rock strength σ for the case at hand:

$$\frac{WOB}{\sigma} = A0 + A1\left(\frac{d-dAv}{Std\ d}\right) + A2\left(\frac{d-dAv}{Std\ d}\right)^2 + \ldots + An\left(\frac{d-dAv}{Std\ d}\right)^n$$

or, $$WOB = \sigma\left[A0 + A1\left(\frac{d-dAv}{Std\ d}\right) + A2\left(\frac{d-dAv}{Std\ d}\right)^2 + \ldots + An\left(\frac{d-dAv}{Std\ d}\right)^n\right]$$

where the weight on the drill bit cutting structure (WOB) is shown for the rock strength σ encountered by the drill bit in the given case. In particular embodiments, the appropriate parameters of polynomial coefficients, dAv, and Std d must be used for the value of d in the calculation. The first segment parameters are used for d<0.06 [in/rev] and the second segment parameters are used for d≥0.06 [in/rev]. A similar equation is used to calculate the weight on a reamer cutting structure (WOR) using the polynomial coefficients of each segment of the reamer characteristic curve, replacing WOB with WOR, and the rock strength σ that the reamer encounters in the given case.

FIG. 28 shows the details of the weight analysis for a BHA with a drill bit and one reamer. Starting with the initial value of d=(dmin+dmax)/2, the rock strength encountered by the drill bit $\sigma_B$, and the rock strength encountered by the reamer $\sigma_R$ in the given case, the weight on bit and weight on reamer are calculated, summed, and the summed weight compared to the system weight. If the summed weight is less than the system weight, dmin is reset to the current value of d, dmax is kept the same, and a new value of d=(dmin+dmax)/2 is used in the weight calculations. If the summed weight is greater than the system weight, dmax is reset to the current value of d, dmin is kept the same, and a new value of d=(dmin+dmax)/2 is used in the weight calculations. This iterative process is repeated until the summed weight equals the system weight within a tolerance of 0.1 [lb] or until a limit of 1000 iterations is reached. If a solution is found, the current value of d in the last iteration is the valid value of d for all cutting structures and for the system of cutting structures in the BHA. The current value of the weight on bit (WOB) and weight on reamer (WOR) in the last iteration are also the valid values for those parameters and are consistent with the valid value of d and the system weight WSYS. If 1000 iterations are reached before convergence, an error condition exists and an error message is displayed to the user. Other error tolerance conditions, such as summed weight being within a percentage of system weight, say within a tolerance of 0.1%, or 1.0%, could also be implemented.

Once the valid values of d, WOB and WOR are determined for the case, configuration, and WSYS, values for TOB and TOR can be determined through the use of the torque based characteristic curve for each cutting structure without further iteration. Recall that d is the x-axis of the torque based characteristic curve and that the x-axis of each segment of the characteristic curve has been recentered and rescaled through the use of dAv and Std d. Recall also that TOB/WOB is the y-axis of the torque based characteristic curve for a drill bit and TOR/WOR is the y-axis of the torque based characteristic curve for a reamer. Recall also that the coefficients (B0, B1, B2, . . . Bn) of a polynomial curve fit for each segment of each characteristic curve are stored in a database of cutting structure characteristic curves along with dAv and Std d for each segment of each characteristic curve. The appropriate parameters of polynomial coefficients, dAv, and Std d must be used for the value of d in the calculation. The first segment parameters are used for d<0.06 [in/rev] and the second segment parameters are used for d≥0.06 [in/rev]. Thus, to calculate torque on a cutting structure at the known valid value of d the algorithm only needs to know WOB or WOR for the case at hand from the previous weight analysis:

$$\frac{TOB}{WOB} = B0 + B1\left(\frac{d-dAv}{Std\ d}\right) + B2\left(\frac{d-dAv}{Std\ d}\right)^2 + \ldots + Bn\left(\frac{d-dAv}{Std\ d}\right)^n$$

or, $$TOB = WOB\left[B0 + B1\left(\frac{d-dAv}{Std\ d}\right) + B2\left(\frac{d-dAv}{Std\ d}\right)^2 + \ldots + Bn\left(\frac{d-dAv}{Std\ d}\right)^n\right]$$

where the torque on the drill bit cutting structure (TOB) is shown for the weight on bit (WOB) applied to the drill bit in the given case, configuration, and WSYS. A similar equation is used to calculate the torque on a reamer cutting structure (TOR) using the polynomial coefficients of the reamer characteristic curve, and replacing TOB with TOR and WOB with WOR in the above equations. The system torque TSYS is determined by summing the torques of all the cutting structures in the BHA as previously discussed. In this example where the system contains one drill bit and one reamer cutting structure:

TSYS [ftlb]=TOB [ftlb]+TOR [ftlb]

In addition, once the valid value of d is determined for the case, configuration, and WSYS it is straightforward to calculate the ROP and duration for that scenario using the RPM value entered in the Drilling Parameters screen (FIG. 18) and the drilled length of the case, where:

$$ROP[ft/hr] = RPM[rev/min] \times d[in/rev] \times \left(\frac{60[min/hr]}{12[in/ft]}\right)$$

DURATION[hr] = Caselength[ft] / ROP[ft/hr]

Figure 19:
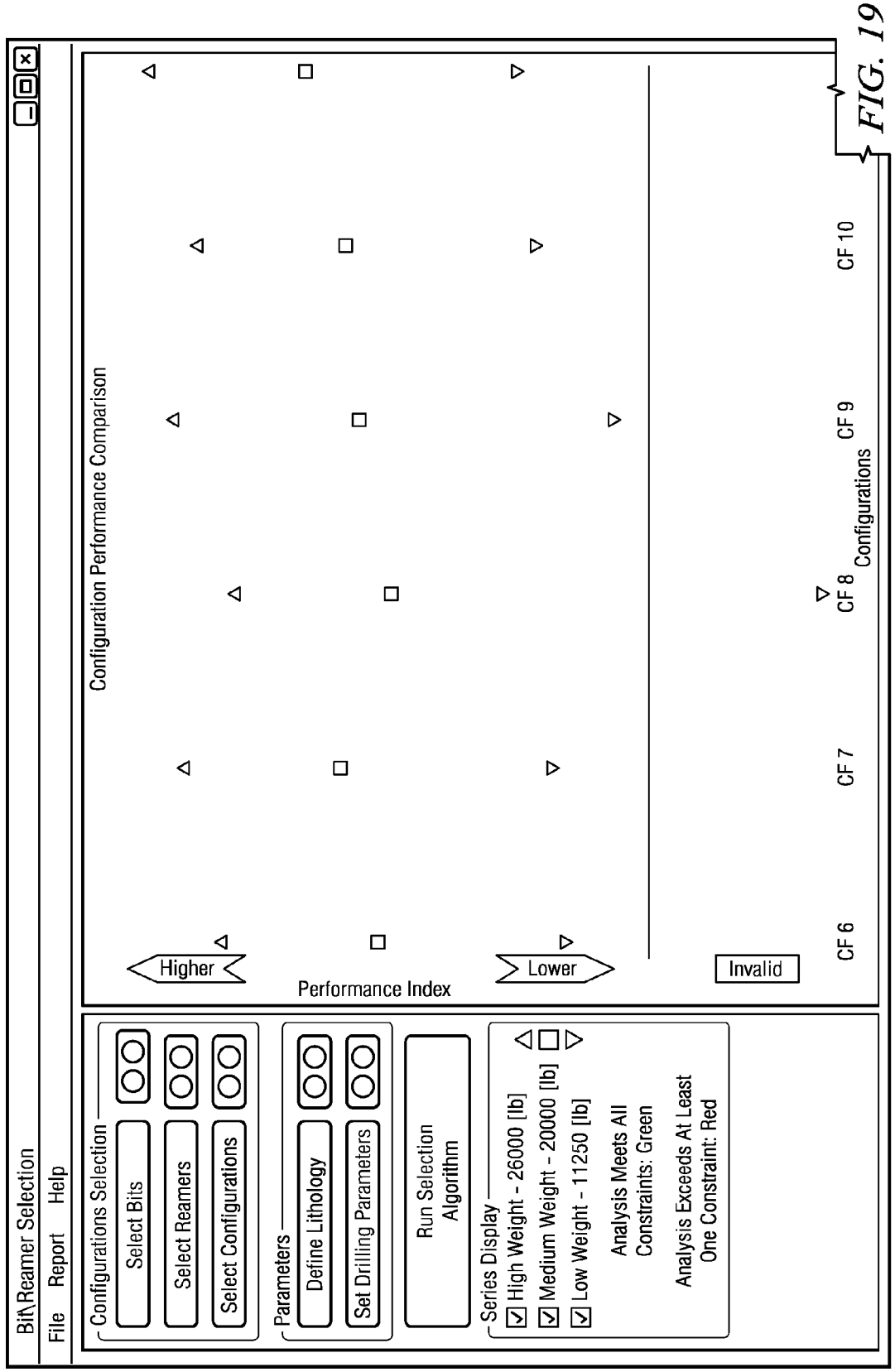

The case lengths for a given configuration and WSYS are summed for all the cases (total length drilled) and divided by the sum of all the durations (total time to drill) to provide an overall ROP. This overall ROP value is set equal to the Performance Index for that scenario. Other measures of Performance Index could be used instead or in addition: preferred WOB/WOR ratios or range of ratios, preferred WOB values or range, preferred WOR values or range, preferred d values or range, preferred torque values or range, lowest specific energy required, and the like. The Performance Index can be represented with a symbol on a chart. For example, FIG. 19 illustrates the display of relative performance of each configuration, at each "weight on system." In FIG. 19, higher on the screen reflects better performance (e.g., ROP). Moreover, a color scheme may be used to identify compliance with constraints. For example, green symbols may be used if the configuration does not violate any constraint at any point in the lithology, at the given drilling parameters (in particular, weight on system). Conversely, red symbols are used to indicate that one or more constraints are violated. Also, some symbols may represent "invalid" conditions, those where there was a computational problem or where the model results exceed physically possible conditions (such as excessive depth of advancement per revolution, d). Invalid symbols, when they occur, are given a gray color and are placed at the bottom of the Performance Index chart FIG. 19 in a segregated area that is labeled "Invalid."

If the configuration violates a constraint at any case across the lithology, an indication of that violation (red symbol) may be displayed. If the configuration passes all the way through all the case analyses without violating any constraint, a green symbol is displayed. Symbols may be "clicked on" to display more detailed information, such as to determine which cases might violate a constraint and why.

Figure 20:
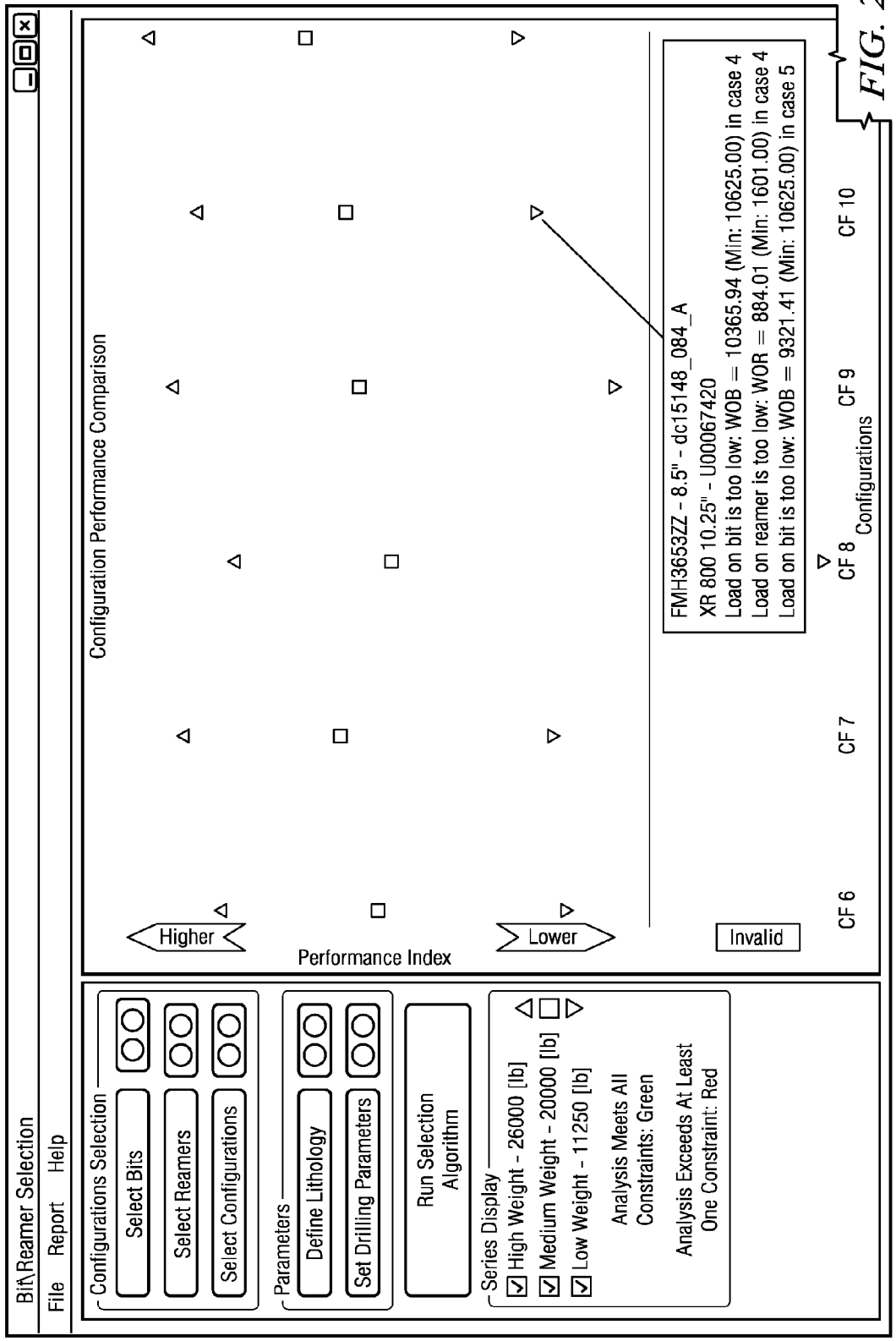

Accordingly, when a red symbol identifies that a constraint is violated, the computer program allows the user to investigate and obtain additional information regarding the violation. For example, in FIG. 20, the user has moved a cursor over a red symbol to determine what caused the violation. For example, the user can identify that the load on bit (WOB) is too low in Case 4; the load on reamer (WOR) is too low in Case 4; and the load on bit (WOB) is too low in Case 5. The computer program also gives the values that violated the constraint(s) as well as the value of the constraint(s) itself to allow the user to assess the significance of the violation.

In accordance with the teachings of the present invention, a substantial amount of information is available, regarding each BHA configuration. For example, the user interface may be used to display (i) weight sharing between cutting structures (WOB, WOR and percentage of WSYS); (ii) torque sharing between cutting structures (TOB, TOR and percentage of TSYS); and/or (iii) neutral point locations along the BHA.

Figure 21:
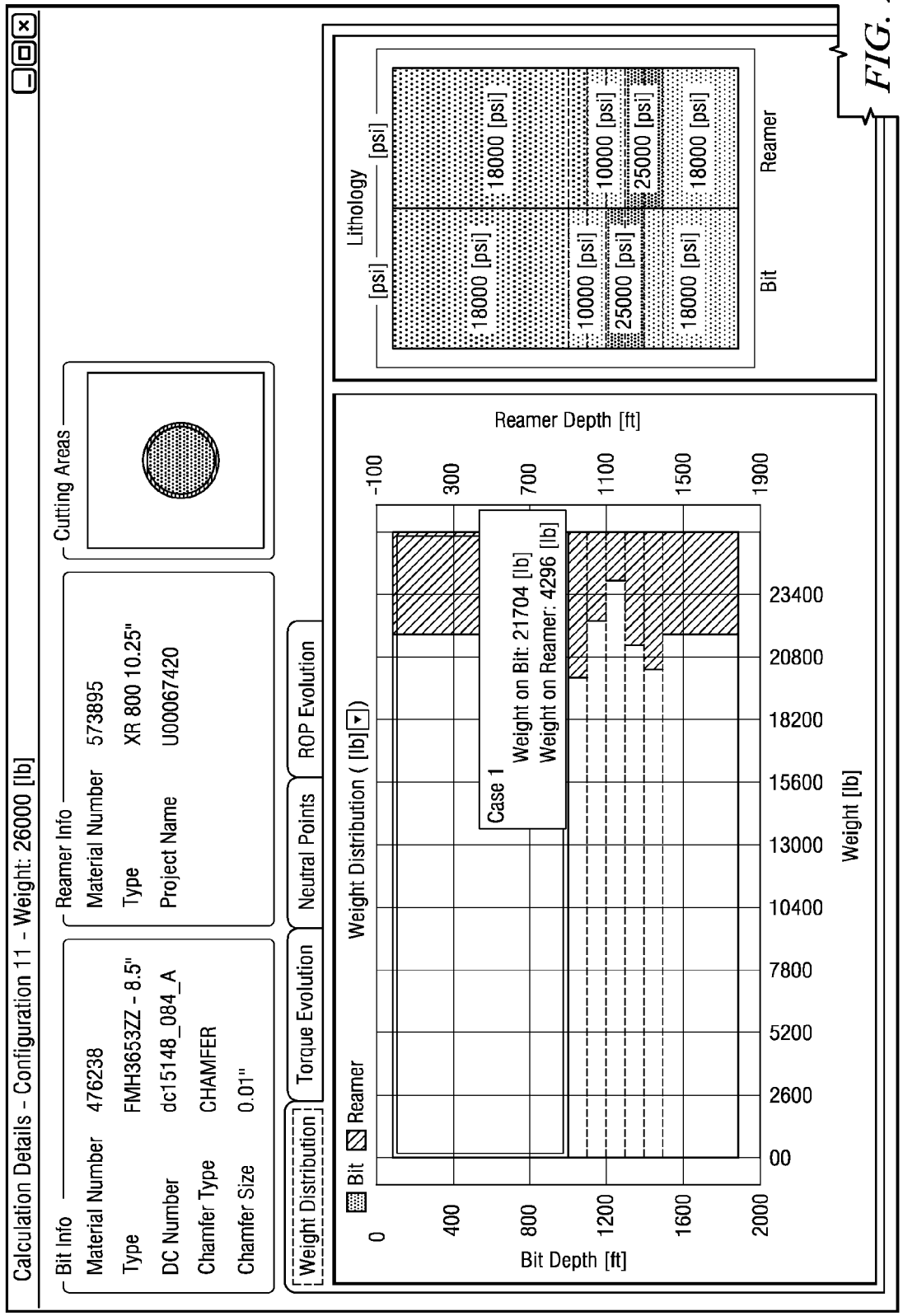

For weight sharing, FIG. 21 illustrates the screen shot that a user obtains from "clicking on" the highest green symbol of FIG. 19. This weight distribution chart is divided into the cases defined by the lithology and cutting structure locations. Each case has a line or box around it creating rows of cases stacked on top of each other down through the lithology. By moving the cursor into one of the cases, the user interface illustrates the weight distribution between the bit and reamer for that case. Within the teachings of the present invention, the user interface could display the percent weight distribution. As illustrated in FIG. 21, each "case" is defined by a change in lithology at the reamer or the bit. The particular lithology experienced by the bit or the reamer is illustrated in two columns on the right hand side of FIG. 21.

In accordance with a particular embodiment of the present invention, a lithological column of rock strength σ is defined by the user by depth interval. In alternative embodiments, this information may be derived from other sources such as logs derived from modeling (see SPARTA™ software, available from Halliburton) and "real-time" log monitoring (see INSITE™ software, available from Halliburton).

Multiple cutting structures in a BHA means that there will be intervals where all cutting structures may be in the rock having the same or substantially similar strength, but often the cutting structures will be in rock having different rock strengths. The teachings of the present disclosure employ a computer program that breaks down the depth intervals into cases or increments of consistent lithology (even if the cutting structures are in different rocks) for analysis purposes.

Figure 22:
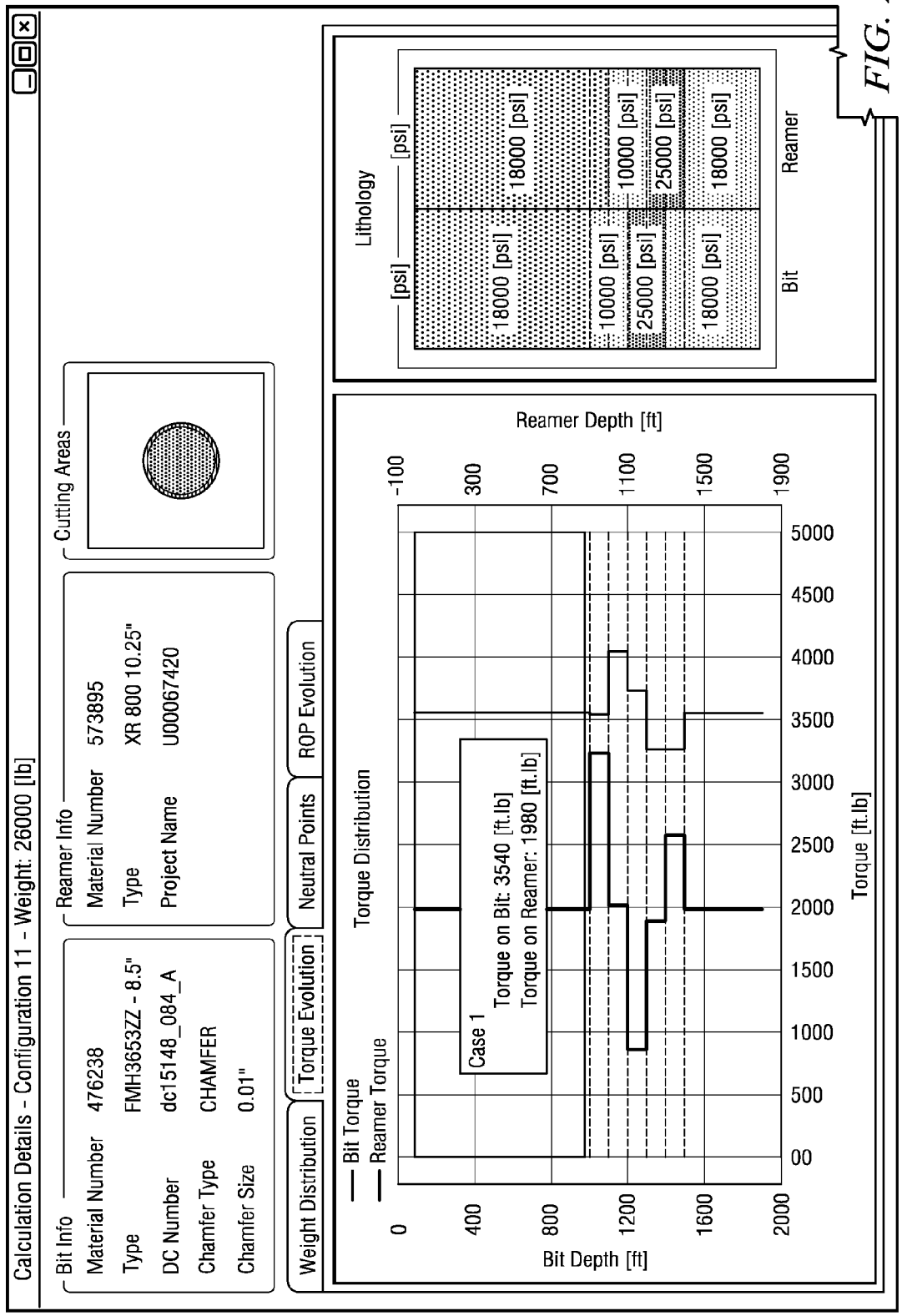

For torque sharing, FIG. 22 is similar to FIG. 21, but it displays the torque distribution in lieu of weight distribution. Thus, by moving the cursor through the different cases of FIG. 22, the user can identify information regarding torque on bit, torque on reamer and/or torque on system, for each case.

Figure 23:
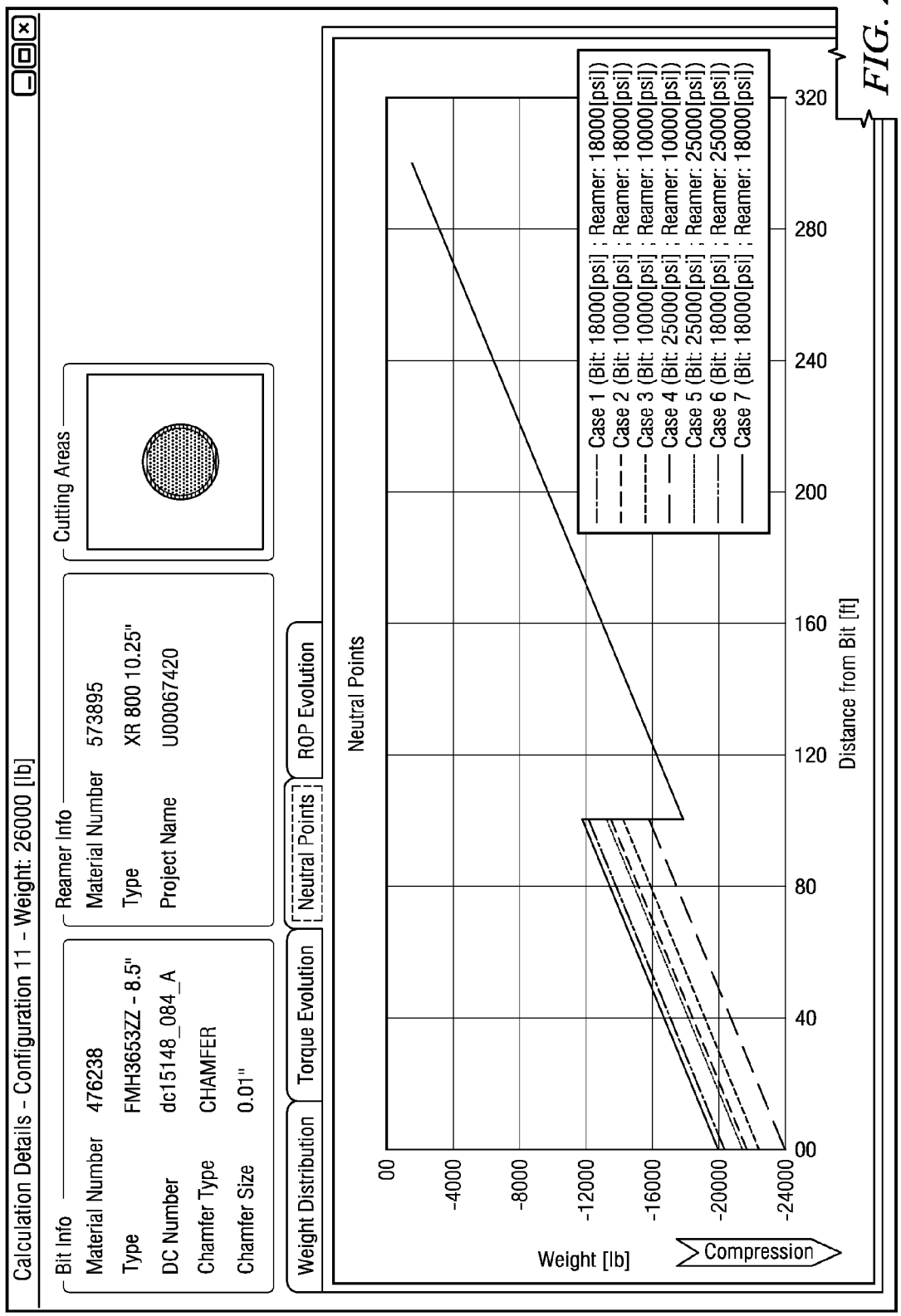
Figure 25:
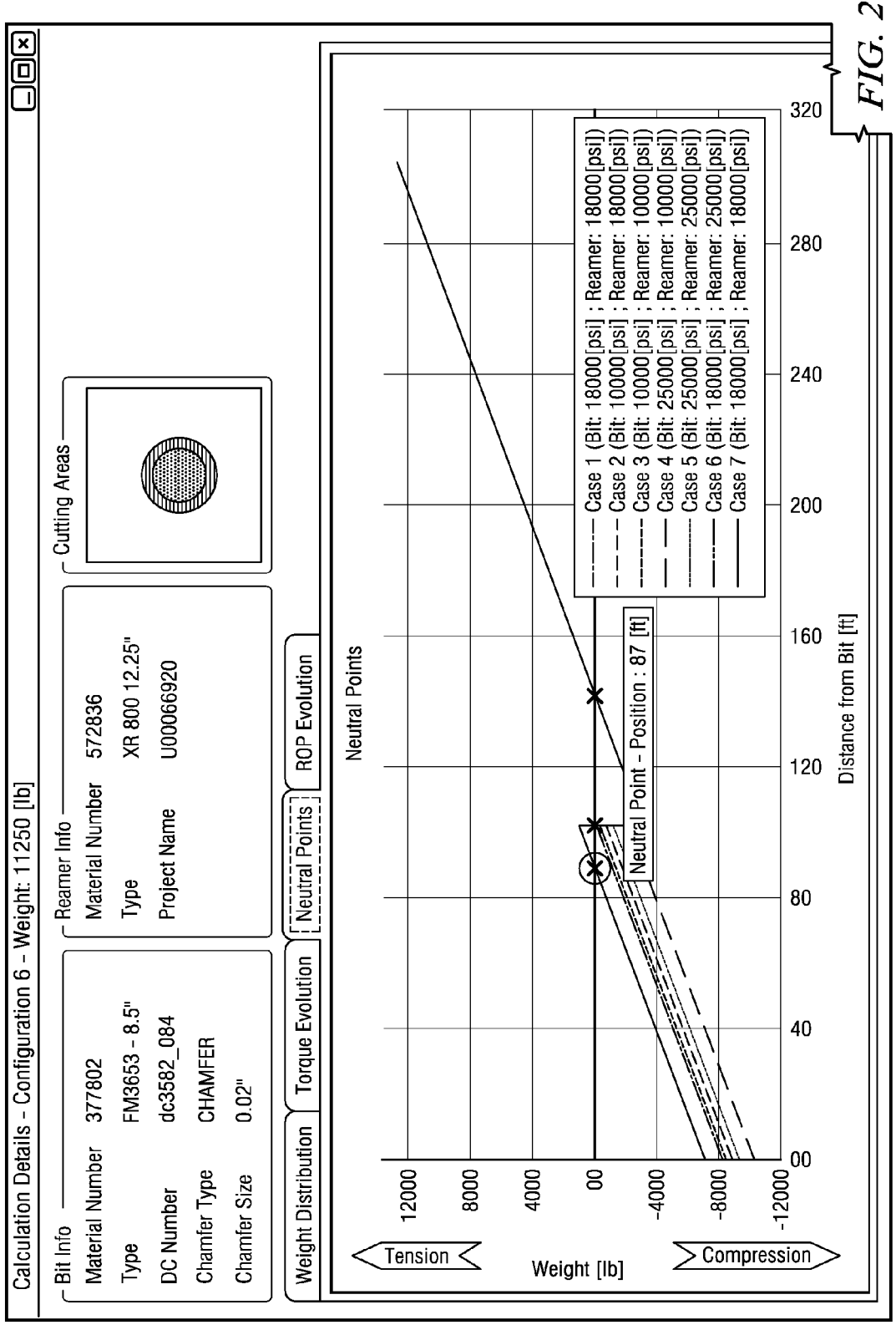

For neutral point locations, FIG. 23 and FIG. 25 are illustrative. A neutral point is a position along the BHA body structure (not the cutting structure) where the effective axial loading is neither in tension nor in compression—typically the crossover point between tension and compression. For example, a BHA hanging vertically off bottom will be in tension (zero at the bottom of the drill bit). When the drill bit is placed on bottom with a certain amount of weight, the length of BHA from the bit upward that equals that WOB is in compression; above that point it is in tension. The transition is referred to as the "neutral point."

Multiple cutting structures in a BHA can lead to multiple neutral points, as weight taken by each cutting structure creates a compressive discontinuity in the BHA. If that compressive discontinuity is larger than the tension that exists (if tension exists), then a neutral point will exist in the BHA body near the cutting structure, and an additional neutral point may exist above the cutting structure as the BHA shifts back again from compression to tension. A BHA with a drill bit and a reamer may have up to three neutral points: (i) one between the drill bit and reamer; (ii) one adjacent the reamer cutting structure; and (iii) one above the reamer cutting structure. Recommendations as to the desirability of a neutral point at the reamer cutting structure vs. tension vs. compression can be valuable in the selection of a given configuration.

The simplest expression of neutral point location is for a vertical BHA with a drill bit in air:

$$L_{NP}[\text{ft}] = \frac{WOB[\text{lb}]}{\omega[\text{lb/ft}]}$$

where $L_{NP}$ is the length from the bottom of the drill bit to the location of the neutral point in the BHA above the drill bit in feet; WOB is the weight on bit in pounds; ω is the linear weight of the BHA in pounds per foot of length.

The BHA is typically immersed in a drilling fluid that is heavier than air, thus a buoyancy effect occurs that effectively reduces the weight of the BHA by the weight of the drilling fluid displaced by the BHA. The effective linear weight of the BHA in drilling fluid is:

$$\omega'[\text{lb/ft}] = \omega[\text{lb/ft}] \times \left(1 - \frac{\rho_{MUD}[\text{lb/gal}]}{\rho_{BHA}[\text{lb/gal}]}\right)$$

Where $\omega'$ is the effective linear weight of the BHA in drilling fluid in pounds per foot of length; $\rho_{MUD}$ is the density of the drilling fluid in pounds per gallon typically ranging from approximately 7.0 [lb/gal] for oil base drilling fluid to 20 [lb/gal] for very dense drilling fluid; and $\rho_{BHA}$ is the density of the BHA material, typically steel with a density of approximately 0.28 [lb/in$^3$] which is approximately equal to 64.7 [lb/gal]. Other BHA materials can be used such as aluminum and titanium which have a lower density than steel, or beryllium copper or tungsten weighting in a drill collar which has higher density than steel.

Thus the expression for the neutral point location for a vertical BHA with a drill bit in drilling fluid is:

$$L_{NP}[ft] = \frac{WOB[lb]}{\omega'[lb/ft]}$$

where $\omega'$ has been substituted for $\omega$.

This equation is further modified to account for the inclination, $\theta$, or deviation of the wellbore/BHA from vertical in degrees. When the wellbore is deviated from vertical, the effective component of BHA weight per foot along the BHA axis in drilling fluid is $\omega'\cos(\theta)$. Thus, the expression of the neutral point location in a BHA with a drill bit in drilling fluid is:

$$L_{NP}[ft] = \frac{WOB[lb]}{\omega'[lb/ft] \times \cos(\theta[deg])}$$

The utility of this expression becomes less useful at high inclinations approaching 90 [deg]. In this event, the calculated neutral point exceeds the length of a typical BHA and the application of this expression is beyond the intended scope of use.

This latest expression of neutral point is valid for a BHA with a drill bit. It is also valid for a BHA containing both a drill bit and a reamer above the drill bit to determine the neutral point location between the drill bit and the reamer. If the WOB exceeds the effective weight of the BHA between the drill bit and reamer (accounting for buoyancy and inclination), then the entire length of BHA between the drill bit and reamer is in compression and no neutral point exists in this span of BHA.

The expression of the axial force along the BHA is:

$$F[lb] = \omega'[lb/ft] \times \cos(\theta[deg]) \times L[ft] - WOB[lb]$$

where F is the axial force within the BHA in pounds at a distance L in feet above the drill bit. This expression is valid for a BHA with a drill bit. It is also valid for a BHA containing both a drill bit and a reamer above the drill bit to determine the axial force in the BHA between the drill bit and reamer. If F is negative at a distance L above the drill bit, the BHA is in compression at that location. If F is positive at a distance L above the drill bit, the BHA is in tension at that location. If F equals zero at a distance L above the drill bit, then this location is at a neutral point in the BHA. This basic expression allows the calculation and plotting of the curves in FIG. 23 and FIG. 25 and tells the user the state of axial force along the BHA. Note, that between the drill bit and reamer, the force F only depends on the WOB and the effective weight of the BHA between the drill bit and reamer. This force F does not depend on the WOR or the weight of the BHA above the reamer.

In a BHA with a drill bit and a reamer, at the reamer cutting structure, the WOR that is applied by the BHA creates a compressive discontinuity in the BHA near the reamer cutting structure equal in magnitude to the WOR. If the BHA is in tension just below the reamer cutting structure, the BHA can transition rapidly to compression near the cutting structure if the WOR exceeds the state of tension. If the BHA is in compression just below the reamer cutting structure, the BHA will go further into compression near the cutting structure due to the WOR. Above this point, the force $F_{AR}$ in the BHA above the reamer is expressed by:

$$F_{AR}[lb] = \begin{bmatrix} \omega'_{AR}[lb/ft] \times \cos(\theta[deg]) \times (L_{AR}[ft] - L_{REAM}[ft]) + \\ \omega'_{BR}[lb/ft] \times \cos(\theta[deg]) \times L_{REAM}[ft] \end{bmatrix} - WSYS[lb]$$

where $F_{AR}$ is the axial force within the BHA in pounds at a distance $L_{AR}$ in feet above the drill bit; $\omega'_{AR}$ and $\omega'_{BR}$ are the effective linear weights of the BHA in drilling fluid above and below the reamer respectively; $\theta$ is the wellbore or BHA inclination in degrees; $L_{REAM}$ is the distance in feet from the drill bit to the reamer cutting structure; and WSYS is the weight on system in pounds. Setting $F_{AR}$ equal to zero allows the location of a neutral point above the reamer to be calculated as:

$$L_{NPAR}[ft] = \frac{WSYS[lb] - \omega'_{BR}[lb/ft] \times \cos(\theta[deg]) \times L_{REAM}[ft]}{\omega'_{AR}[lb/ft] \times \cos(\theta[deg])} + L_{REAM}[ft]$$

where $L_{NPAR}$ is the value of $L_{AR}$ at the location of the neutral point above the reamer in feet. This equation is only valid when $L_{NPAR}$ is greater than $L_{REAM}$. If the BHA is in compression at the reamer cutting structure, another neutral point can exist above the reamer as the BHA moves from compression to tension. For this to happen, the applied WSYS has to be larger than the weight of the BHA below the reamer.

FIG. 23 illustrates neutral points of the BHA, if any. As illustrated in FIG. 23, the entire BHA is in compression (i.e., no "neutral point"—point where the curve crosses the x-axis). It may not be desirable to have this case where the entire BHA is in compression, and therefore a user may opt to remove this configuration from consideration.

FIG. 25 illustrates neutral points associated with a BHA that violates constraints at a lower weight on system, where WSYS=11,250 [lb]. Three neutral points are illustrated for a particular curve for Case 2 (the uppermost curve) for a BHA containing one drill bit and one reamer located 100 [ft] above the drill bit. In this case, the WOB is equal to 7,107 [lb] and that amount of compression exists in the BHA at the bottom of the drill bit. Moving up the BHA from the drill bit, less compression is observed until finally the curve crosses the x-axis into tension at a distance of 87 [ft] above the drill bit. Continuing upward from the drill bit above 87 [ft], the BHA moves further into tension. A little higher up at 100 [ft] above the drill bit, the reamer cutting structure takes the WOR of 4,143 [lb] and a compressive discontinuity of this magnitude exists in the body of the reamer (part of the BHA) near the cutting structure. This compressive discontinuity is large enough to exceed the 1,038 [lb] of tension that would otherwise exist at this location in the BHA. As the curve crosses the x-axis again, this time moving into 3,105 [lb] of compression, another neutral point is created in the BHA at 100 [ft] above the drill bit. Moving further upward in the BHA above 100 [ft], less compression is observed until the curve once again crosses the x-axis, creating a third neutral point in the BHA at 138 [ft] above the bottom of the drill bit.

Figure 24:
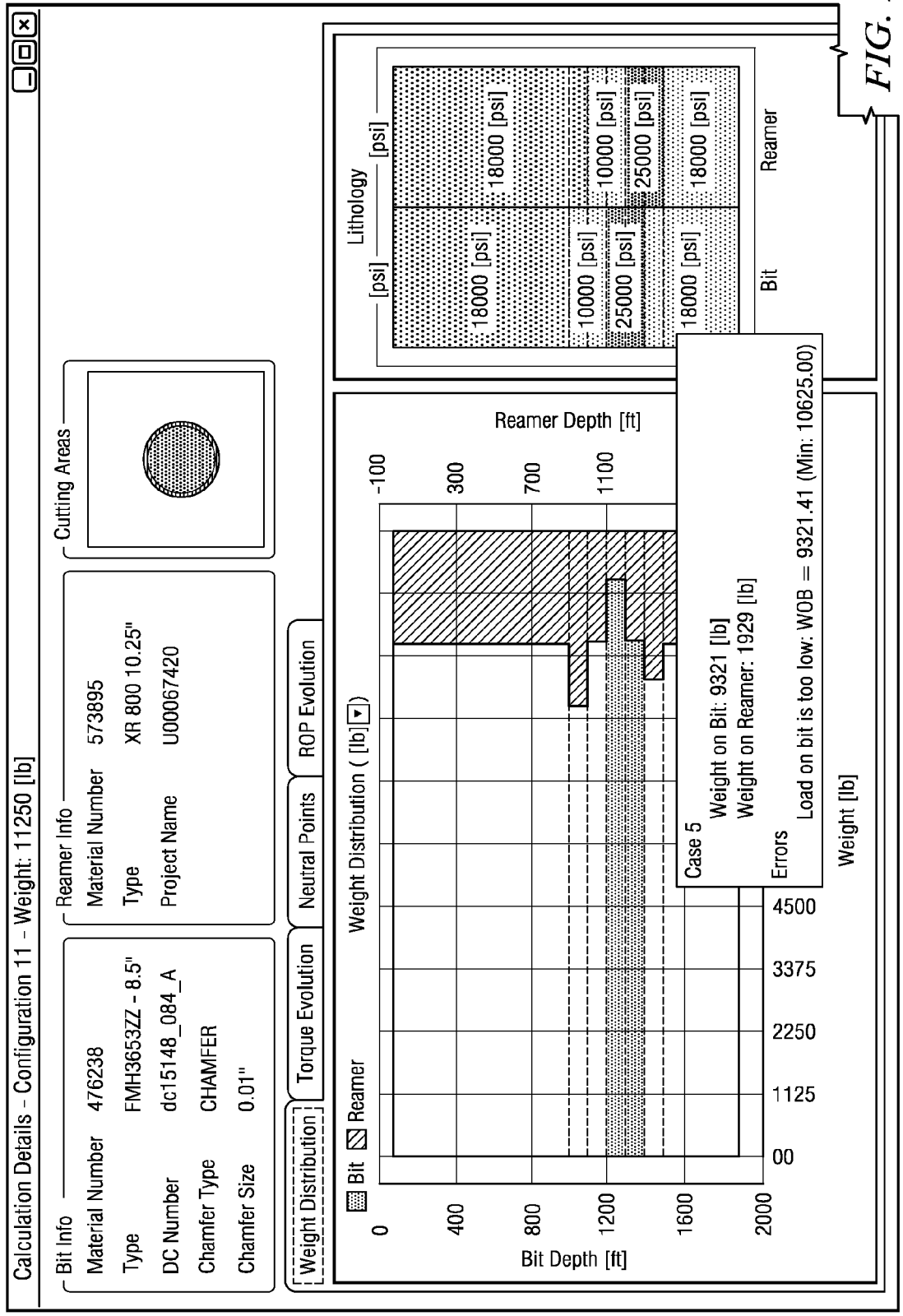

FIG. 24 illustrates additional detail regarding constraint violations for a given case. After the user clicks on a red symbol to obtain information regarding the violations, the user may obtain this screen. This screen shot illustrates the weight distribution of the BHA, and illustrates more detail about the constraint violation of Case 5 of the lithology of this particular configuration and applied system weight.

Additional functionality included in the computer program is the ability to save files containing configurations, lithology, and drilling parameters that are entered in the program. The files can then be loaded into the program at will instead of the user reentering the information. It is also desirable for project files containing all of the information entered for a project to be saved and reloaded.

One of the many uses of the computer program is to help achieve designs of drill bit and/or reamer cutting structures that meet desired performance criteria. For example, it may be desired to achieve certain a WOB/WOR ratio, such a WOB/WOR=1.0 where the weight distribution between the drill bit and reamer are close to equal under a given set of conditions. The computer program allows the user to analyze the result of the designs of both cutting structures and determine in which direction one or both cutting structures could be changed to meet the desired result. For example, if WOB/WOR=2.0 but the desired result is WOB/WOR=1.0, the user can determine that the drill bit is taking a larger proportion of the system weight. Changing the design of the drill bit cutting structure to make it drill faster and/or changing the design of the reamer cutting structure to make it drill slower will help accomplish the desired result. After the cutting structure(s) is redesigned (using IBitS or IReamS), it will have a new characteristic curve and the polynomial coefficients can be added to the database. The performance of the redesigned cutting structure(s) can be reanalyzed using the computer program to see if it approaches the desired result. This process can be repeated as necessary until the desired result is achieved.

By storing coefficients of the characteristic curve fits in the cutting structure database, extremely fast calculation of the Performance Index (ROP), WOB, WOR, TOB, TOR can be performed for each configuration and case. This speed of execution enables the calculation of thousands of cases in a few seconds, making the algorithm very useful to find configurations that are suitable and either don't violate any constraints, or don't substantially violate any constraints.

The systems, methods, algorithms and/or software described within this disclosure may be embodied in a computer system 100 for example, as illustrated in FIG. 30. Computer system 100 includes a communication interface 102 that is configured and operable to receive data, a processor(s) 104 for processing data, tangible computer readable medium (e.g., memory) 106 for storing data, and a graphical user interface (e.g., display) 108 for use by a user(s) of the system 130.

The teachings of the present disclosure provide a system and method to identify one or more BHA systems that may be suitable for a particular application. In some embodiments, a user may opt to obtain even more detail regarding such systems by analyzing these selected few configurations (out of many) in a modeling software (e.g., IBits and IReams), armed with new knowledge of the loads applied.

The invention claimed is:

1. A method, comprising:
receiving, at a computer system, a plurality of characteristic curves, each of the plurality of characteristic curves corresponding to a cutting structure, the plurality of characteristic curves including a weight on the cutting structures as a function of a rate of penetration of the cutting structures;
receiving, at the computer system, a selection of a first system including a first combination of at least two selected cutting structures, the first combination including a drill bit and a reamer;
receiving, at the computer system, a selection of a second system including a second combination of at least two selected cutting structures, the second combination including a drill bit and a reamer, the first combination being different from the second combination;
calculating, by the computer system, a first system characteristic curve for the first system based on the characteristic curves corresponding to the selected cutting structures in the first combination, the first system characteristic curve comprising a sum of the characteristic curves for each cutting structure of the first combination;
calculating, by the computer system, a second system characteristic curve for the second system based on the characteristic curves corresponding to the selected cutting structures in the second combination;
generating, by the computer system, a comparison of the first system characteristic curve with the second system characteristic curve; and
selecting, at the computer system, one of the first system or the second system based on the comparison.

2. The method of claim 1, wherein the first system characteristic curve includes weight on the first system as a function of a rate of penetration.

3. The method of claim 1, further comprising receiving, at the computer system, lithology information regarding an earth formation, and wherein generating the comparison of the first system characteristic curve with the second system characteristic curve comprises predicting, using the lithology information, relative performance of (i) the first system, and (ii) the second system.

4. The method of claim 1, wherein calculating the first system characteristic curve comprises calculating a weight-based system characteristic curve including varying a weight on the first system as a function of a rate of penetration of the first system.

5. The method of claim 1, wherein calculating the first system characteristic curve comprises calculating a torque-based characteristic curve of the first system that includes varying a torque of the first system as a function of a rate of penetration of the first system.

6. The method of claim 1, wherein calculating the first system characteristic curve comprises:
calculating a weight-based system characteristic curve including varying a weight on the first system as a function of a rate of penetration of first system; and
calculating a torque-based characteristic curve of the first system that includes varying a torque on the first system as a function of a rate of penetration of the first system.

7. The method of claim 1, wherein calculating the first system characteristic curve comprises calculating a two dimensional curve fit that estimates values of performance of the first system across a range of respective rates of penetration.

8. The method of claim 7, wherein the two dimensional curve fit comprises a polynomial curve.

9. The method of claim 1, further comprising storing, on the computer system, the first system characteristic curve.

10. The method of claim 1, wherein the plurality of characteristic curves are derived from performance data that is derived from a plurality of different types of information selected from the group consisting of: computer models, actual downhole measurements, actual surface measurements, and marketing data.

11. The method of claim 1, further comprising:
calculating, by the computer system, weight on bit or weight on reamer as a function of weight on at least one of the first system and the second system; and
displaying, on the computer system, weight on bit or weight on reamer as a function of weight on at least one of the first system and the second system.

12. The method of claim 1, further comprising:
calculating, by the computer system, a plurality of neutral point locations along at least one of the first system and the second system; and
displaying, on the computer system, a plurality of neutral point locations along at least one of the first system and the second system.

13. The method of claim 1, wherein the first system comprises a first drill bit of a first diameter, and the second system comprises a second drill bit of a second diameter that is not equal to the first diameter.

14. A system, comprising:
an interface being operable to receive a plurality of characteristic curves, each of the plurality of characteristic curves corresponding to a cutting structure, the plurality of characteristic curves including a weight on the cutting structures as a function of a rate of penetration of the cutting structures; and
a processor being operable to:
choose a first system including a first combination of at least two selected cutting structures, the first combination including a drill bit and a reamer;
choose a second system including a second combination of at least two selected cutting structures, the second combination including a drill bit and a reamer, the first combination being different from the second combination;
calculate a first system characteristic curve for the first system based on the characteristic curves corresponding to the selected cutting structures in the first combination, the first system characteristic curve comprising a sum of the characteristic curves for each cutting structure of the first combination;
calculate a second system characteristic curve for the second system based on the characteristic curves corresponding to the selected cutting structures in the second combination;
compare the first system characteristic curve with the second system characteristic curve; and
select one of the first system or the second system based on the comparison.

15. The system of claim 14, wherein calculating the first system characteristic curve comprises:
calculating a weight-based system characteristic curve including varying a weight on the first system as a function of a rate of penetration of the first system; and
calculating a torque-based characteristic curve of the first system that includes varying a torque on the first system as a function of a rate of penetration of the first system.

16. A method, comprising:
receiving, at a computer system, a plurality of first characteristic curves, each of the plurality of first characteristic curves for a drill bit;
receiving, at the computer system, a plurality of second characteristic curves, each of the plurality of second characteristic curves for a reamer;
receiving, at the computer system, a selection of a plurality of cutting structure combinations based on the plurality of first and second characteristic curves, each of the plurality of cutting structure combinations including a selected drill bit and a selected reamer;
calculating, by the computer system, a plurality of system characteristic curves, each of the plurality of system characteristic curves combining the first characteristic curve corresponding to the selected drill bit and the second characteristic curve corresponding to the selected reamer, the plurality of system characteristic curves including a weight on the cutting structures as a function of a rate of penetration of the cutting structures, each system characteristic curve comprises a sum of the characteristic curves for the selected drill bit and the selected reamer of the cutting structure combination;
generating, by the computer system, a comparison of each of the plurality of system characteristic curves; and
selecting, at the computer system, a cutting structure combination from the plurality of cutting structure combinations based on the comparison.

17. The method of claim 16, further comprising:
calculating, by the computer system, weight on bit or weight on reamer as a function of weight on at least one of the cutting structure combinations; and
displaying, on the computer system, weight on bit or weight on reamer as a function of weight on at least one of the cutting structure combinations.

18. The method of claim 16, further comprising:
calculating, by the computer system, a plurality of neutral point locations along at least one of the cutting structure combinations; and
displaying, on the computer system, a plurality of neutral point locations along at least one of the cutting structure combinations.

* * * * *